(12) United States Patent
Barrilado et al.

(10) Patent No.: US 9,365,413 B2
(45) Date of Patent: Jun. 14, 2016

(54) TRANSDUCER-INCLUDING DEVICES, AND METHODS AND APPARATUS FOR THEIR CALIBRATION

(71) Applicant: FREESCALE SEMICONDUCTOR, INC., Austin, TX (US)

(72) Inventors: Andres Barrilado, Toulouse (FR); Peter T. Jones, Scottsdale, AZ (US); Stephane Lestringuez, Toulouse (FR); Seyed K. Paransun, Scottsdale, AZ (US); Raimondo P. Sessego, Chandler, AZ (US); James D. Stanley, Phoenix, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 306 days.

(21) Appl. No.: 13/962,717

(22) Filed: Aug. 8, 2013

(65) Prior Publication Data

US 2014/0352400 A1    Dec. 4, 2014

(30) Foreign Application Priority Data

May 29, 2013    (WO) .................. PCT/IB2013/001450

(51) Int. Cl.

| G01P 21/00 | (2006.01) |
|---|---|
| B81B 7/00 | (2006.01) |
| G01P 15/08 | (2006.01) |
| G01C 25/00 | (2006.01) |

(52) U.S. Cl.
CPC .............. *B81B 7/008* (2013.01); *G01C 25/005* (2013.01); *G01P 15/0802* (2013.01); *G01P 21/00* (2013.01)

(58) Field of Classification Search
CPC .... G01C 17/38; G01C 25/005; G01D 18/008; G01P 21/00; G01P 15/18
See application file for complete search history.

(56) References Cited

U.S. PATENT DOCUMENTS

| 4,558,426 | A | * | 12/1985 | Solt, Jr. ......................... 702/116 |
| 4,956,602 | A |   | 9/1990 | Parrish |
| 5,521,393 | A | * | 5/1996 | Burkholder et al. ..... 250/559.22 |

(Continued)

FOREIGN PATENT DOCUMENTS

| EP | 2284546 A2 | 2/2011 |
| GB | 2478561 A | 9/2011 |

(Continued)

OTHER PUBLICATIONS

U.S. Appl. No. 13/465,651, Dawson, C.S., et al., 'Tester and Method for Testing a Strip of Devices', filed May 7, 2012.

(Continued)

*Primary Examiner* — David A Rogers
(74) *Attorney, Agent, or Firm* — Sherry W. Schumm

(57) ABSTRACT

Embodiments of packaged transducer-including devices and methods for their calibration are disclosed. Each device includes one or more transducers, an interface configured to facilitate communications with an external calibration controller, a memory, and a processing component. The external calibration controller sends calibration commands to the transducer-including devices through a communication structure. The processing component of each device executes code in response to receiving the calibration commands. Execution of the code includes generating transducer data from the one or more transducers, calculating calibration coefficients using the transducer data, and storing the calibration coefficients within the memory of the device.

21 Claims, 13 Drawing Sheets

(56) References Cited

U.S. PATENT DOCUMENTS

| | | | |
|---|---|---|---|
| 5,617,431 | A | 4/1997 | Tupuri et al. |
| 6,209,383 | B1 | 4/2001 | Mueller |
| 6,243,654 | B1* | 6/2001 | Johnson et al. .................. 702/85 |
| 6,321,171 | B1* | 11/2001 | Baker ........................... 702/104 |
| 6,629,448 | B1 | 10/2003 | Cvancara |
| 6,758,080 | B1 | 7/2004 | Ragan et al. |
| 7,043,960 | B1 | 5/2006 | Lueck |
| 7,326,922 | B1* | 2/2008 | Mueller ..................... 250/252.1 |
| 7,852,109 | B1 | 12/2010 | Chan et al. |
| 7,892,876 | B2 | 2/2011 | Mehregany |
| 7,930,148 | B1* | 4/2011 | Figaro et al. .................. 702/196 |
| 8,013,759 | B1* | 9/2011 | Aid et al. ...................... 340/904 |
| 8,117,888 | B2* | 2/2012 | Chan et al. ..................... 73/1.38 |
| 2007/0023851 | A1 | 2/2007 | Hartzell et al. |
| 2007/0095146 | A1 | 5/2007 | Brosh |
| 2007/0205982 | A1* | 9/2007 | Ishidera et al. ............... 345/158 |
| 2007/0216361 | A1* | 9/2007 | Zelinski et al. ............... 320/132 |
| 2007/0277586 | A1 | 12/2007 | Kamiya |
| 2008/0081958 | A1 | 4/2008 | Denison et al. |
| 2011/0029275 | A1* | 2/2011 | Kennedy et al. ............... 702/141 |
| 2011/0154050 | A1* | 6/2011 | Cordery et al. ............... 713/189 |
| 2011/0288772 | A1* | 11/2011 | Tanino .......................... 701/214 |
| 2012/0203486 | A1* | 8/2012 | Almalki et al. .................. 702/96 |
| 2012/0215477 | A1* | 8/2012 | Tuck et al. ....................... 702/99 |
| 2013/0297248 | A1 | 11/2013 | Dawson et al. |

FOREIGN PATENT DOCUMENTS

| | | |
|---|---|---|
| JP | 2005326384 A | 11/2005 |
| TW | 201128194 A | 8/2011 |

OTHER PUBLICATIONS

U.S. Appl. No. 13/859,490, R.P. Sessego, 'Methods and Apparatus for Calibrating Transducer-including Device', filed Apr. 9, 2013.

Ciganda Brasca, L.M., et al., "A Parallel Tester Architecture for Accelerometer and Gyroscope MEMS Calibration and Test", Journal of Electronic Testing; Theory and Applications, Mar. 11, 2011.

EP Application No. 13180554.1, Extended Search Report and Opinion, mailed Jan. 14, 2014.

EP Application No. 14163199.4-1557, Extended Search Report mailed Jul. 30, 2014, 8 pages.

EP Application No. 14163199.41557, Office Action mailed Sep. 7, 2015, 6 pages.

Non-Final Office Action mailed Sep. 14, 2015 for U.S. Appl. No. 13/859,490, 7 pages.

\* cited by examiner

TRANSDUCER-INCLUDING DEVICES, AND METHODS AND APPARATUS FOR THEIR CALIBRATION

TECHNICAL FIELD

Embodiments of the subject matter described herein relate generally to devices that include one or more transducers ("transducer-including devices"), and methods and apparatus for calibrating transducer-including devices.

BACKGROUND

Accelerometers are being incorporated into an ever expanding variety of electronic systems. For example, MEMS (MicroElectroMechanical Systems) accelerometers now are commonly used in automotive systems and in consumer and industrial electronics.

After fabricating a MEMS accelerometer, a calibration process typically is performed in the factory to determine trim adjustment values for each accelerometer sensing axis. The trim adjustment values may then be stored in a memory of a device within which the accelerometer ultimately is incorporated.

Conventional methods of calibrating accelerometers tend either to use expensive device handling and calibration equipment, or to perform the calibrations with low levels of automation and/or parallelism (e.g., only a single device or a small number of devices are calibrated simultaneously). High equipment expense and/or deficiencies in automation and/or parallelism detrimentally impact accelerometer manufacturing costs. Accelerometer manufacturers are forced to absorb the costs by offering products at lower margins and/or by including the relatively high manufacturing costs in their product pricing, potentially making their products less competitive in the marketplace.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation or embodiment described herein as exemplary or as an example is not necessarily to be construed as preferred or advantageous over other implementations or embodiments. Furthermore, there is no intention to be bound by any expressed or implied theory presented in the preceding technical field, background, or the following detailed description.

Embodiments of the subject matter described herein include methods and apparatus for calibrating (or "trimming") devices that include one or more transducers ("transducer-including devices"), and more specifically devices that include one or more sensors configured to sense gravitational force, movement (e.g., acceleration, rotation), electromagnetic field strength, pressure, and so on. For example, various embodiments of the calibration methods and apparatus discussed herein may be used in conjunction with devices having any combination of one or more accelerometers, gyroscopes, magnetometers (or "magnetic sensors"), pressure sensors, and/or other types of sensors. Embodiments more specifically relate to calibrating sensors included within packaged devices, where the sensors produce electrical signals indicating the magnitudes of various accelerations, forces, and/or fields with respect to one or more device-fixed axes or surfaces. An example of a packaged device that may be calibrated using the various calibration methods and apparatus is discussed below in conjunction with FIG. 1.

Figure 1:
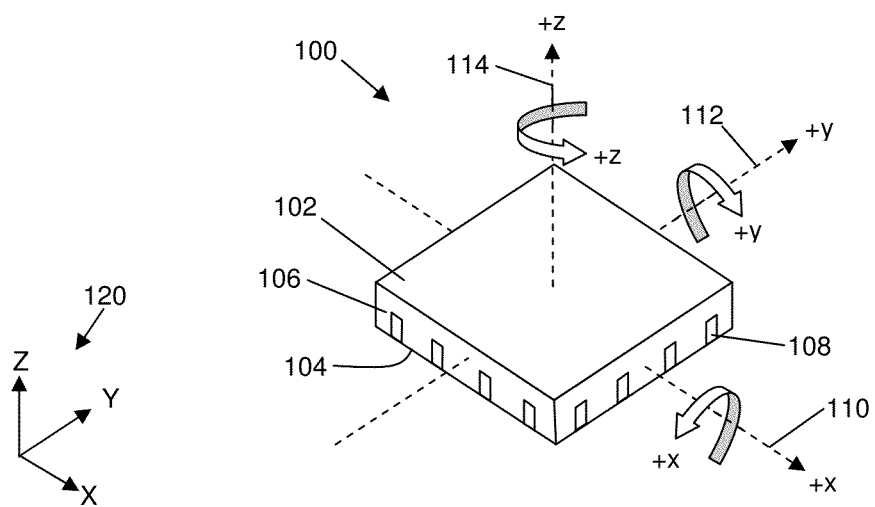
FIG. 1 is an external view of a transducer-including device, in accordance with an example embodiment.

More specifically, FIG. 1 is an external view of a transducer-including device 100, in accordance with an example embodiment. Device 100 includes various internal electrical components (e.g., transducers and other components) housed within a package body. For example, as will be discussed in more detail in conjunction with FIG. 2, device 100 may include any combination of one or more accelerometers (e.g., accelerometers 212-214, FIG. 2), gyroscopes (e.g., gyroscopes 222-224, FIG. 2), magnetometers (e.g., magnetometers 232-234, FIG. 2), pressure sensors, and/or other types of sensors.

The package body is defined by a top surface 102, a bottom surface 104, and side surfaces 106. Conductive contacts 108 exposed at an exterior of the package body facilitate communication between the internal electrical components and external electrical systems (not illustrated in FIG. 1). For example, contacts 108 provide for communication of various signals and voltage references (e.g., power and ground) between the internal electrical components and an external electrical system. Contacts 108 are shown in FIG. 1 as being essentially flush with the side surfaces 106 of the package body, and thus the device 100 may be considered to be a "leadless" package. However, the various embodiments also may be implemented using packages with protruding leads (i.e., packages with leaded chip carriers), packages with contact arrays (e.g., ball grid array (BGA) packages, pin grid array (PGA) packages, and so on). In addition, although contacts 108 are shown to be exposed at the side surfaces 106 of the device 100, the various embodiments also may be implemented using packages with contacts that are exposed on any surface (e.g., all four side surfaces 106, only two side surfaces 106, the top surface 102, and/or the bottom surface 104). Finally, a device may have more or fewer contacts 108 than is shown in the example device 100 of FIG. 1.

According to various embodiments, the transducers within device 100 may be configured to produce electrical signals indicating the magnitudes of various accelerations, forces, fields, and/or rotation velocities with respect to one or more device-fixed axes, such as orthogonal, device-fixed axes 110, 112, and 114, arbitrarily labeled as "x," "y," and "z," respectively for convenience. The device-fixed axes 110, 112, 114 are fixed with respect to the device 100, and according to an embodiment, each device-fixed axis 110, 112, 114 may be aligned with a sensing axis of one or more transducers within the device 100 (e.g., x-axis 110 may be aligned with the sensing axis of an x-axis accelerometer 212, an x-axis gyroscope 222, and/or an x-axis magnetometer 232, FIG. 2). As device 100 is moved in space, each of the device-fixed axes 110, 112, 114 may be angularly offset from corresponding orthogonal axes of an inertial coordinate system (e.g., orthogonal axes "X," "Y," and "Z" of a fixed, inertial coordinate system 120). In the description herein, it is to be assumed that the Earth's gravity field is in the −Z direction of the inertial coordinate system 120. Further, as will be explained in more detail below, it is to be assumed that device 100 is held in a fixed orientation in space by a structure (not shown) that exerts a reaction force on the device 100 in the +Z direction. Accordingly, when device 100 is in the orientation shown in FIG. 1 (i.e., with zero angular difference between z-axis 114 and the corresponding Z-axis of inertial coordinate system 120), the device 100 would experience a +1 G acceleration due to gravity along its z-axis 114 in the +Z direction of the inertial coordinate system 120. Conversely, the device 100 would experience a 0 G acceleration due to gravity (i.e., no acceleration) along its x- and y-axes 110, 112.

According to an embodiment, device 100 includes a three-axis accelerometer, with a first accelerometer (e.g., accelerometer 212, FIG. 2) configured to sense the magnitude of a force along the x-axis 110, a second accelerometer (e.g., accelerometer 213, FIG. 2) configured to sense the magnitude of a force along the y-axis 112, and a third accelerometer (e.g., accelerometer 214, FIG. 2) configured to sense the magnitude of a force along the z-axis 114. Alternatively, device 100 may include a one-axis or a two-axis accelerometer, or no accelerometer at all. In addition or alternatively, device 100 may include a three-axis gyroscope in an embodiment, which includes a first gyroscope (e.g., gyroscope 222, FIG. 2) configured to sense the rate of rotation around the x-axis 110, a second gyroscope (e.g., gyroscope 223, FIG. 2) configured to sense the rate of rotation around the y-axis 112, and a third gyroscope (e.g., gyroscope 224, FIG. 2) configured to sense the rate of rotation around the z-axis 114. Alternatively, device 100 may include a one-axis or a two-axis gyroscope, or no gyroscope at all. In addition or alternatively, device 100 may include a three-axis magnetometer in an embodiment, which includes a first magnetometer (e.g., magnetometer 232, FIG. 2) configured to sense the intensity of a magnetic field along the x-axis 110, a second magnetometer (e.g., magnetometer 233, FIG. 2) configured to sense the intensity of a magnetic field along the y-axis 112, and a third magnetometer (e.g., magnetometer 234, FIG. 2) configured to sense the intensity of a magnetic field along the z-axis 114. Alternatively, device 100 may include a one-axis or a two-axis magnetometer, or no magnetometer at all. Device 100 may include one or more additional or different types of sensors, as well (e.g., pressure sensors, temperature sensors, chemical sensors, and so on). As used herein, the term "sense," when referring to an action performed by a transducer, means that the transducer produces an electrical signal indicating the magnitude of an acceleration, a force or a field impinging upon the transducer, or the rate of an angular acceleration (rotation) experienced by the transducer.

Figure 2:
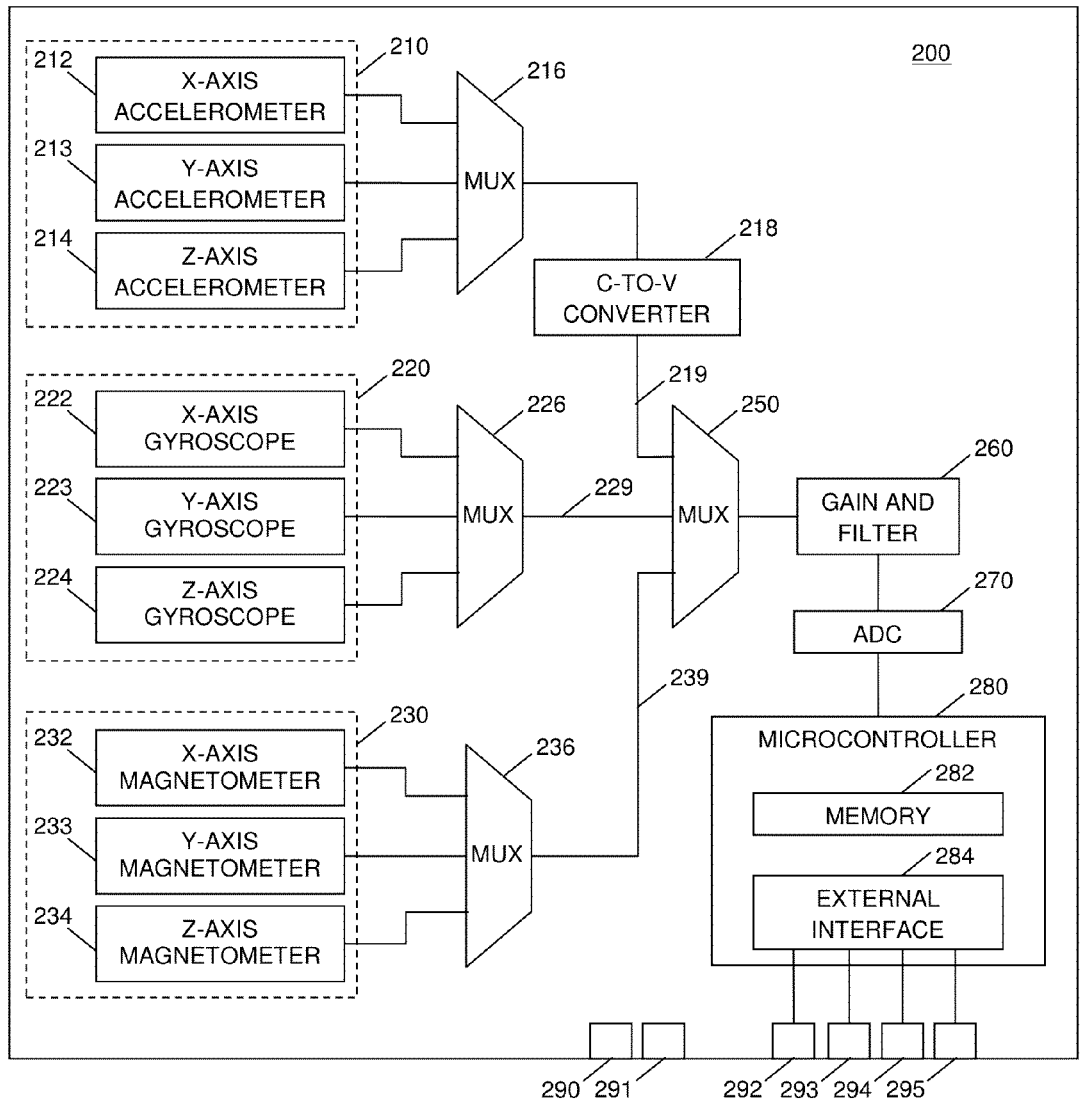
FIG. 2 is a simplified block diagram of a device that includes multiple transducers, in accordance with an example embodiment.

FIG. 2 is a simplified block diagram of a device 200 that includes multiple transducers 212-214, 222-224, 232-234, in accordance with an example embodiment. More specifically, device 200 includes a three-axis accelerometer 210, a three axis gyroscope 220, and a three axis magnetometer 230, in an embodiment. Accelerometer 210 includes x-axis accelerometer 212 configured to sense the magnitude of acceleration (e.g., due to gravity) along an x-axis of the device 200 (e.g., x-axis 110, FIG. 1), y-axis accelerometer 213 configured to sense the magnitude of acceleration (e.g., due to gravity) along a y-axis of the device 200 (e.g., y-axis 112, FIG. 1), and z-axis accelerometer 214 configured to sense the magnitude of acceleration (e.g., due to gravity) along a z-axis of the device 200 (e.g., z-axis 114, FIG. 1). Accelerometers 210 may function to measure static acceleration (e.g., for quantifying the tilt angles experienced by device 200) and/or dynamic accelerations (e.g., for quantifying dynamic acceleration of device 200 in a particular direction). According to alternate embodiments, device 200 may include only a subset of accelerometers 212-214, or may have no accelerometer at all. Gyroscope 220 includes x-axis gyroscope 222 configured to sense the rate of rotation around the x-axis of the device 200, y-axis gyroscope 223 configured to sense the rate of rotation around the y-axis of device 200, and z-axis gyroscope 224 configured to sense the rate of rotation around the z-axis of device 200. According to alternate embodiments, device 200 may include only a subset of gyros 222-224, or may have no gyroscope at all. Magnetometer 230 includes x-axis magnetometer 232 configured to sense the intensity of a magnetic field along the x-axis of the device 200, y-axis magnetometer 233 configured to sense the intensity of a magnetic field along the y-axis of the device, and z-axis magnetometer 234 configured to sense the intensity of a magnetic field along the z-axis of the device 200. According to alternate embodiments, device 200 may include only a subset of magnetometers 232-234, or may have no magnetometer at all. Device 200 may include one or more additional or different types of sensors, as well (e.g., pressure sensors, temperature sensors, chemical sensors, and so on).

According to an embodiment, device further includes multiplexers 216, 226, 236, 250 (MUXs), gain and filter circuitry 260, analog-to-digital converter 270 (ADC), and microcontroller 280 (or another suitable control and/or processing component). Microcontroller 280 may include memory 282 (e.g., data and instruction registers, Flash memory, read only memory (ROM), and/or random access memory (RAM)), although all or portions of memory 282 may be external to microcontroller 280, as well. Memory 282 may be used to store a variety of types of persistent and temporary information or data, such as executable software instructions (e.g., instructions associated with implementation of the various embodiments), data (e.g., data generated based on transducer output signals ("transducer data" herein), configuration coefficients, and so on), device parameters, and so on. Further, microcontroller 280 may include an external interface 284, which is configured to facilitate communication between microcontroller 280 and an external electrical system (not illustrated in FIG. 2) through conductive contacts 292, 293, 294, 295 exposed at an exterior of device 200. For example, external interface 284 may include a Serial Peripheral Interface (SPI), an Inter-Integrated Circuit ($I^2C$), another type of interface, or a combination of various types of interfaces. Device 200 may further include conductive contacts 290, 291 configured to convey voltage references (e.g., power and ground) to various nodes and/or internal electrical components of device 200. Although six contacts 290-295 are illustrated in FIG. 2 for purpose of example, it should be understood that device 200 may include more or fewer contacts 290-295.

Under control of microcontroller 280, MUXs 216, 226, 236, 250 enable one signal at a time to be selected from accelerometers 212-214, gyroscopes 222-224, and magnetometers 232-234, and provided to gain and filter circuitry 260. Gain and filter circuitry 260 includes an amplifier, which is configured to apply a pre-determined voltage or power gain to the selected signal (e.g., as specified by a gain value or code selected during a calibration process). In addition to an amplifier, gain and filter circuitry 260 includes a filter configured to filter the signal (either before or after amplification) in order to eliminate spurious, out-of-band signal components, to filter out signal components caused by undesired mechanical vibrations, and/or to filter out electrical noise (e.g., from other circuitry of device 200). The resulting analog signal is provided to ADC 270, which samples the analog signal and converts the samples into a sequence of digital values. Each digital value indicates the magnitude of an acceleration, a force or a magnetic field impinging upon the device 200 (e.g., when the value corresponds to a signal from the accelerometer 210 or gyroscope 220, respectively), or the rate of acceleration around an axis (e.g., when the value corresponds to a signal from the magnetometer 230).

According to an embodiment, and as will be explained in more detail later, based on commands received via one or more contacts 292-295 (e.g., from calibration controller 310, FIG. 3), microcontroller 280 participates in a calibration process in which microcontroller 280 may select a particular transducer output signal (e.g., via MUXs 216, 226, 236, 250) and store digital values corresponding to the transducer output signal in memory 282. In addition, microcontroller 280 processes the stored digital values to determine calibration coefficients (e.g., gain and offset values or codes) for the transducers 212-214, 222-224, 232-234. Microcontroller 280 also stores the calculated calibration coefficients in memory 282, according to an embodiment. Ultimately, during normal operation of the device 200 (e.g., after incorporation of device 200 into a larger electrical system), the gain values or codes determined during the calibration process are retrieved from memory 282 and used to set the pre-determined gain applied by the amplifier of the gain and filter circuitry 260. In addition, the offset values or codes determined during the calibration process are retrieved from memory 282 and used to set 0 G readings to a target value during normal operation (e.g., a value close to the center of the supply voltage to provide the greatest output voltage swing).

For example, in an embodiment, device 200 is configured to control the amplifier of gain and filter circuitry 260 to apply a specific gain to received transducer output signals. The device 200 may maintain a table of gain codes (e.g., in memory 282), where each gain code corresponds to one of a plurality of gain values. During the calibration processes described in more detail below, a particular gain value or gain code may be selected for each transducer 212-214, 222-224, 232-234. During normal operation, the gain code selected for a particular transducer 212-214, 222-224, 232-234 may be used to establish the gain applied by the amplifier for signals received from that transducer 212-214, 222-224, 232-234. For example, as shown in Table 1, below, a gain code table may include a plurality of gain codes and corresponding gain values that span a range of gains that may be applied to the signals:

TABLE 1

Gain codes and corresponding gains

| Gain code | Gain |
|---|---|
| 0001 | 1.0 |
| 0010 | 1.5 |
| 0011 | 2.0 |
| 0100 | 2.5 |
| 0101 | 3.0 |
| 0110 | 3.5 |
| 0111 | 4.0 |
| 1000 | 4.5 |

For example purposes only, Table 1 includes eight gain code entries, although a gain code table may include more or fewer entries, as well. In addition, the gain codes and/or gain values within a gain code table may be different from those depicted in Table 1.

Along with controlling the gain applied by the amplifier, device 200 also may be configured to apply a voltage offset (or "offset") to received transducer signals, in order to adjust the 0 G bias level for each transducer 212-214, 222-224, 232-234. Accordingly, the device 200 may maintain a table of offset codes (e.g., in memory 282), where each offset code corresponds to one of a plurality of offset values. Also during the calibration processes described below, a particular offset value or offset code may be selected for each transducer 212-214, 222-224, 232-234. During normal operations, the offset code selected for a particular transducer 212-214, 222-224, 232-234 may be used to apply a voltage offset to signals received from that transducer 212-214, 222-224, 232-234. For example, as shown in Table 2, below, an offset code table may include a plurality of offset codes and corresponding offset values that span a range of offsets that may be applied to the signals:

TABLE 2

Offset codes and corresponding offsets

| Offset code | Offset |
|---|---|
| 0001 | 0.03 V |
| 0010 | 0.06 V |
| 0011 | 0.09 V |
| 0100 | 0.12 V |

TABLE 2-continued

Offset codes and corresponding offsets

| Offset code | Offset |
|---|---|
| 0101 | 0.15 V |
| 0110 | 0.18 V |
| 0111 | 0.21 V |
| 1000 | 0.24 V |

For example purposes only, Table 2 includes eight offset code entries, although an offset code table may include more or fewer entries, as well. In addition, the offset codes and/or offset values within an offset code table may be different from those depicted in Table 2. According to an embodiment, the offset values included within an offset code table may vary from device to device. For example, part of the calibration process may include determining the linear region of a device's amplifier, and determining offset codes for the offset code table that correspond to the device-specific linear region.

Accelerometers 212-214 may be MEMS accelerometers, for example. Typically, a MEMS accelerometer includes a mass with a first electrode, which is suspended over a second electrode that is fixed with respect to the accelerometer substrate. The first electrode, the second electrode, and the air gap between the first and second electrodes form a capacitor, and the value of the capacitor is dependent upon the distance between the first and second electrodes (i.e., the width of the air gap). As the mass is acted upon by an external force (e.g., gravitational force), the first electrode may move closer to or farther from the second electrode, and thus the capacitance value may decrease or increase, accordingly. Other accelerometer configurations also are possible, including configurations in which signals indicating multiple capacitances are generated. According to an embodiment, each accelerometer 212-214 produces an electrical signal indicating the value of such capacitance(s).

According to an embodiment, device 200 includes MUX 216, as mentioned previously, and further includes capacitance-to-voltage (C-to-V) converter 218. The electrical signals indicating the capacitance values associated with accelerometers 212-214 are provided to MUX 216, which may selectively provide one of the signals to C-to-V converter 210 based on a control signal from microcontroller 280. C-to-V converter 218 is configured to convert the capacitance value into a voltage signal on line 219, where the voltage signal has a magnitude that is proportional to the capacitance value associated with the accelerometer 212-214 selected by MUX 216. In an alternate embodiment, device 200 may include a C-to-V converter for each accelerometer 212-214, and a MUX instead could be used to select a voltage signal output from one of the C-to-V converters.

Gyroscopes 222-224 may be MEMS gyroscopes, for example. Typically, a MEMS gyroscope includes a moving mass with an electrode ("movable electrode"), which is suspended adjacent to a second electrode ("fixed electrode") that is fixed with respect to the gyroscope substrate. When the substrate is rotated about an axis perpendicular to the direction of motion of the moving mass, the mass experiences a force in the third orthogonal direction of magnitude $2mv\Omega$, where m is the mass, v the velocity, and $\Omega$ is the rotation rate. A displacement due to this force will occur, which is dependent on the spring constant of the suspension of the moving mass. The fixed electrode is placed so that the distance between the fixed and movable electrodes will change due this motion. The force may be calculated from the change in distance by measuring capacitance, for example, and the rotation rate may then be calculated from the expression for the force. The mass, m, is known by design, and the velocity, v, is determined from the conditions set up for the movable mass and the design of its suspension, which includes electrodes to drive the movable mass into resonance by application of sinusoidal voltages. In alternative types of gyroscopes, rather than utilizing a mass that moves in a straight line, an oscillating disk may be used. The oscillating disk will respond to substrate rotations perpendicular the disk axis of rotation according to the right hand rule $A \times \Omega$, where A is along the disk axis of rotation, and $\Omega$ is along the substrate rotation direction. Electrodes beneath the disk can be positioned to measure separation between the disk and substrate to allow calculations of substrate rotation rate that are similar to the calculations discussed above for the linear case. Other gyroscope configurations also are possible.

According to an embodiment, device 200 includes MUX 226, as mentioned previously. The electrical signals from gyroscopes 222-224 are provided to MUX 226, which may selectively provide one of the signals to MUX 250.

Magnetometers 232-234 may be implemented using Hall effect devices, magnetic film devices such as anisotropic magneto resistance (AMR) devices, giant magneto resistance devices (GMR), spin valves, tunnel junction devices (MTJ), Lorentz force devices, or other types of magnetometer devices, in various embodiments. Hall devices rely on the deflection of carriers flowing along a resistive element to form a potential in a direction perpendicular to the flow. This voltage is given by $V=IB/(ned)$, where I is the current, B is the magnetic field strength, n is the carrier concentration, e is the electronic charge, and d is the thickness of the resistive layer. AMR, GMR, spin-valve, and MTJ devices rely on the change in resistance of the structures as function of the strength of a magnetic field relative to a preferred direction for lowest resistance. AMR devices can include films of one magnetic material, for example. GMR devices consist of stacks of metal films, for example, one magnetic film on top, one non-magnetic film in the middle, and another magnetic film on the bottom. Current flow laterally along the stack produces a high resistance due to the magnetic layers being oriented anti-parallel by the magnetic field of the current. This produces more scattering at the interfaces and therefore higher resistance. Application of an external magnetic field overcomes the field of the current, producing a parallel alignment of the magnetizations and lower resistance. In the case of a spin valve, one of the layers has a magnetization that is fixed in direction. MTJ devices are similar to spin valves, except that the non-magnetic layer is insulating and current flow is by tunneling through the insulating junction. The magnetic layers may themselves consist of stacks of varying compositions. To facilitate measurements, magnetic sensing elements are often arranged in bridge configurations. Lorentz force devices rely on the force exerted by an external magnetic field on a current carrying element such as a wire or coil. By using MEMS structures that can move an amount proportional to the applied force, the strength of the external field can be calculated. Such MEMS structures are typically driven by an alternating current at the resonant frequency of the structure to increase the movement and hence increase sensitivity. In one additional type of magnetic sensor device, a permanent magnetic layer is substituted for the conductive element, and displacement of the structure occurs due to torque produced by an external field. Displacement of these structures may be measured by capacitive sensing or by strain gauges.

According to an embodiment, device 200 includes MUX 236, as mentioned previously. The electrical signals from magnetometers 232-234 are provided to MUX 236, which may selectively provide one of the signals to MUX 250.

MUX 250 is configured to select, based on a control signal from microcontroller 280, one of the received inputs on lines 219, 229, 239 for provision to gain and filter circuitry 260. Although a particular configuration of multiplexers is illustrated in FIG. 2 to allow selection of a signal from a particular one of transducers 212-214, 222-224, 232-234, is it to be understood that other multiplexer configurations and circuitry could provide the same functionality, including a configuration that includes a single multiplexer that receives and selects from output signals from all of the transducers 212-214, 222-224, 232-234.

As indicated above, microcontroller 280 is configured to communicate with an external electrical system. According to a particular embodiment, after fabricating device 200, device 200 may be installed in a device calibration system (e.g., system 300, FIG. 3) for the purpose of calibrating device 200 (e.g., calculating gain and offset values or codes). In conjunction with the calibration process, microcontroller 280 may receive one or more commands from the calibration system that cause microcontroller 280 to select transducer outputs, store digital values corresponding to the transducer outputs, calculate device calibration coefficients (e.g., gain and offset values or codes) based on the stored digital values, and store the device calibration coefficients.

Various embodiments of device calibration systems and methods of calibrating a plurality of devices will now be described. Some of the embodiments may be used to calibrate devices such as those discussed above in conjunction with FIG. 2. Other embodiments may be used to calibrate devices that are different in configuration from the embodiments discussed in conjunction with FIG. 2. For example, but not by way of limitation, various embodiments may be used to calibrate devices that do not include a microcontroller (e.g., microcontroller 280) and/or internal memory (e.g., memory 282). In such cases, an embodiment of a calibration system may receive digital sensor outputs directly, and may calculate the device calibration coefficients based on the received sensor outputs. In an embodiment in which a device includes internal memory, the calibration system may cause the device calibration coefficients to be stored on the device. Otherwise, the device calibration coefficients may later be stored in a memory device of an electronic system into which the device ultimately is incorporated.

Figure 3:
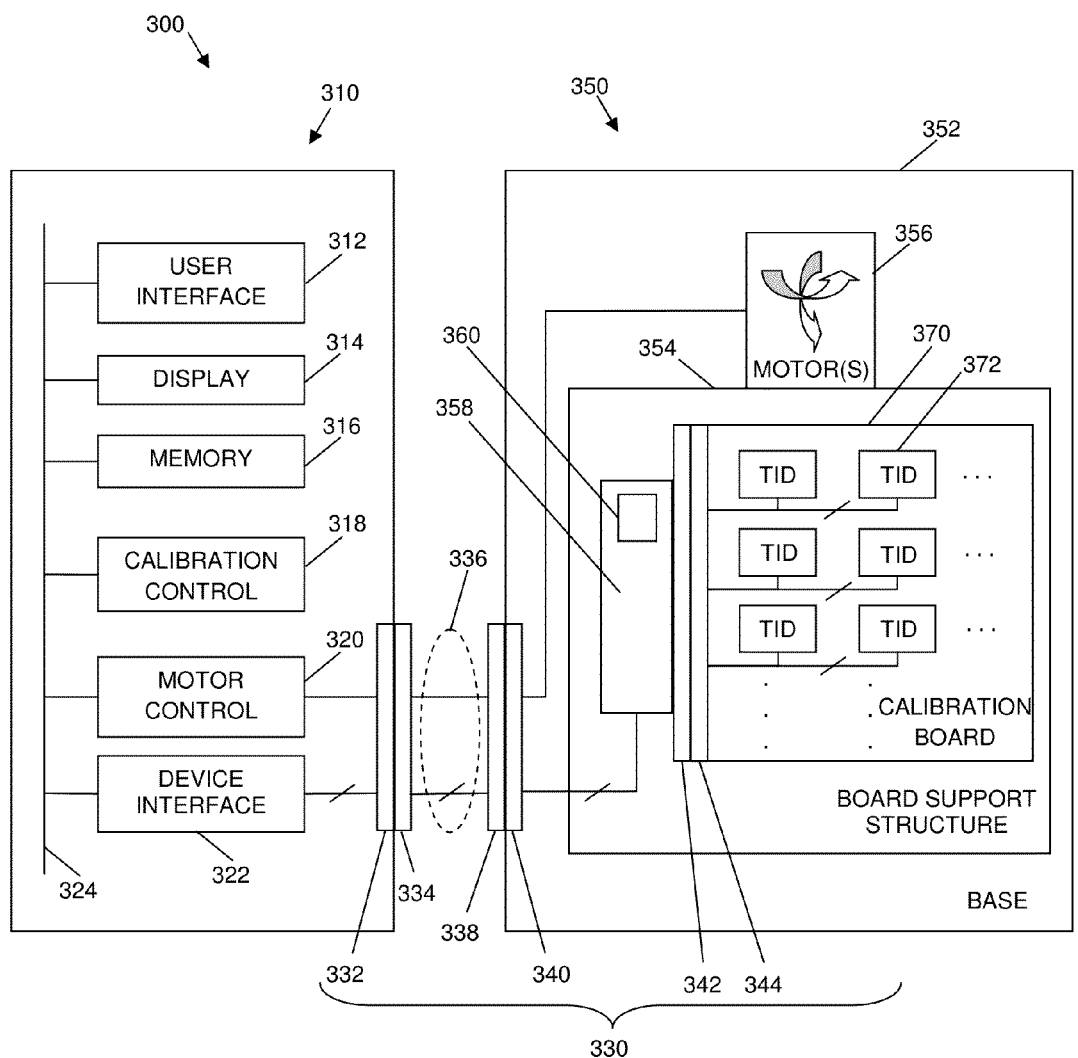
FIG. 3 is a simplified block diagram of a device calibration system, in accordance with an example embodiment.

FIG. 3 is a simplified block diagram of a device calibration system 300, in accordance with an example embodiment. Calibration system 300 includes a calibration controller 310, a device handling system 350, and one or more calibration boards 370. As will be discussed in more detail below, each calibration board 370 includes a plurality of sockets (e.g., sockets 420, FIG. 4) within which a plurality of transducer-including devices 372 ("TIDs") may be inserted. The calibration board sockets also include conductive contacts configured to electrically connect with corresponding contacts of the transducer-including devices 372. More particularly, the socket contacts are coupled with conductors on the calibration board 370, and the conductors on the calibration board 370 ultimately are coupled with a communication structure 330 that enables communication between the transducer-including devices 372 and the calibration controller 310. Although only one calibration board 370 is shown in FIG. 3, a system may include multiple calibration boards, which may be supported by a single board support structure, as described below. In addition, to increase parallel manufacturing capabilities, a system may include multiple device handling systems 350.

According to an embodiment, under the control of calibration controller 310, the device handling system 350 transitions the calibration board 370 (and thus the transducer-including devices 372) through a series of physical orientations. During this process, the calibration controller 310 communicates with the transducer-including devices 372 in order to cause each transducer-including device 372 to sense magnitudes of accelerations, fields or forces with respect to one or more device-fixed axes (e.g., axes 110, 112, 114, FIG. 1) and/or to sense rate of rotation around one or more device-fixed axes. In addition, in an embodiment, the calibration controller 310 also causes each transducer-including device 372 to calculate calibration coefficients (e.g., gain and offset values or codes) and to store the calibration coefficients in a memory of the transducer-including device 372 (e.g., memory 282, FIG. 2).

In order for communication between the calibration controller 310 and the transducer-including devices 372 to occur, system 300 also includes a communication structure 330. In an embodiment, the communication structure 330 includes a plurality of conductors and connectors, which enable communication of various signals and voltage references (e.g., power and ground) between the calibration controller 310 and the transducer-including devices 372. For example, in an embodiment, the communication structure 330 may include a first structure that electrically interconnects the calibration controller 310 and the device handling system 350. For example, the first structure may include a first, multi-conductor connector 334, a plurality of conductive lines 336, and a second, multi-conductor connector 338. The first structure may be in the form of a flexible, multi-conductor cable with connectors 334, 338 on either end of the cable, for example. The connector 334 on one end of the cable may be configured to mate with a corresponding, multi-conductor connector 332 of the calibration controller 310, and the connector 338 on the other end of the cable may be configured to mate with a corresponding, multi-conductor connector 340 of the device handling system 350. Additional conductors and connectors (e.g., connectors 342, 344) of the device handling system 350 and the calibration board 370 may complete the communication structure 330, thus enabling the calibration controller 310 to communicate with the transducer-including devices 372. Although an example of a communication structure 330 is illustrated in FIG. 3 and described herein, it is to be understood that an alternate embodiment may include any suitable communication structure, including but not limited to a communication structure that includes one or more wireless communication links. Thus, the given example should not be construed as limiting.

According to an embodiment, the device handling system 350 includes a base 352, a rotatable board support structure 354, one or more motors 356, a first connector 340 configured to electrically interface with the calibration controller 310 (e.g., via one or more additional connectors 332, 334, 338 and conductive lines 336), a second connector 342 configured to electrically interface with the calibration board 370 (e.g., via a corresponding connector 344 of the calibration board 370), and a plurality of conductors (not numbered) between the first and second connectors 340, 342. In addition, in an embodiment, the device handling system 350 may include a circuit board 358 electrically coupled to the second connector 342. The circuit board 358 may include a microcontroller 360 (or other suitable control and/or processing component), a memory (not illustrated), and/or other components. In addition, in another embodiment, the device handling system 350 also may include a magnetic field generator (not illustrated) configured to produce a magnetic field that passes through the board support structure 354. The magnetic field generator may be activated prior to calibrating the transducer-including devices 372 (or more specifically, prior to calibrating magnetometers of the transducer-including devices 372). Alternatively, the Earth's magnetic field may be used to calibrate magnetometers of the transducer-including devices 372.

The base 352 is configured to support one or more of the motor(s) 356 in a fixed position, and to support the board support structure 354 in a manner that enables the board support structure 354 to be rotated around one or more axes by the motor(s) 356, in an embodiment. According to another embodiment, a first motor 356 that is mounted to the base 352 may be used to change the orientation of a second motor 352 (e.g., a two-axis gimbal structure may be used to enable two motors 356 to rotate the board support structure 354 around multiple axes).

According to an embodiment, the board support structure 354 is configured to hold the calibration board 370 in a fixed position with respect to itself. Accordingly, as the board support structure 354 is rotated by the motor(s) 356, the calibration board 370 also is rotated by the same angle. Further, when transducer-including devices 372 are installed in the sockets of the calibration board 370, the transducer-including devices 372 also are rotated by the same angle. In other words, the device handling system 350 is configured simultaneously to rotate the board support structure 354, calibration board 370, and transducer-including devices 372 around one or more axes. At any given time, the orientation of the board support structure 354 defines the orientations of the calibration board 370 and the transducer-including devices 372.

As mentioned above, the device handling system 350 includes a connector 342, which is configured to electrically interface with a corresponding connector 344 of the calibration board 370. According to an embodiment, connectors 342, 344 are held together by the force of friction, and a human operator may readily install calibration board 370 into the device handling system 350 by aligning the connector 344 of the calibration board 370 with the connector 342 of the device handling system 350, and pushing the calibration board 370 toward connector 342 using a reasonable pressure applied to the calibration board 370 (i.e., the calibration board 370 is configured to be coupled with the board support structure 354 by connecting the connectors 342, 344 using a reasonable force). In another embodiment, the calibration board connection operation may be performed by an automated board-handling system without the intervention of a human operator (e.g., an automated board-handling system may pick up the calibration board 370 and load it into the device handling system 350). Either way, once connectors 342, 344 are firmly mated, electrical connections are established between the calibration controller 310 and transducer-including devices 372 installed in the sockets of the calibration board 370. A calibration process may thereafter be performed, as described in more detail below. After completion of the calibration process, the human operator (or an automated board-handling system) may thereafter remove the calibration board 370 from the device handling system 350 by pulling the calibration board 370 away from connector 342 using a reasonable force (i.e., the calibration board 370 is configured to be removed from the board support structure 354 by disconnecting the connectors 342, 344 using a reasonable force).

Figure 4:
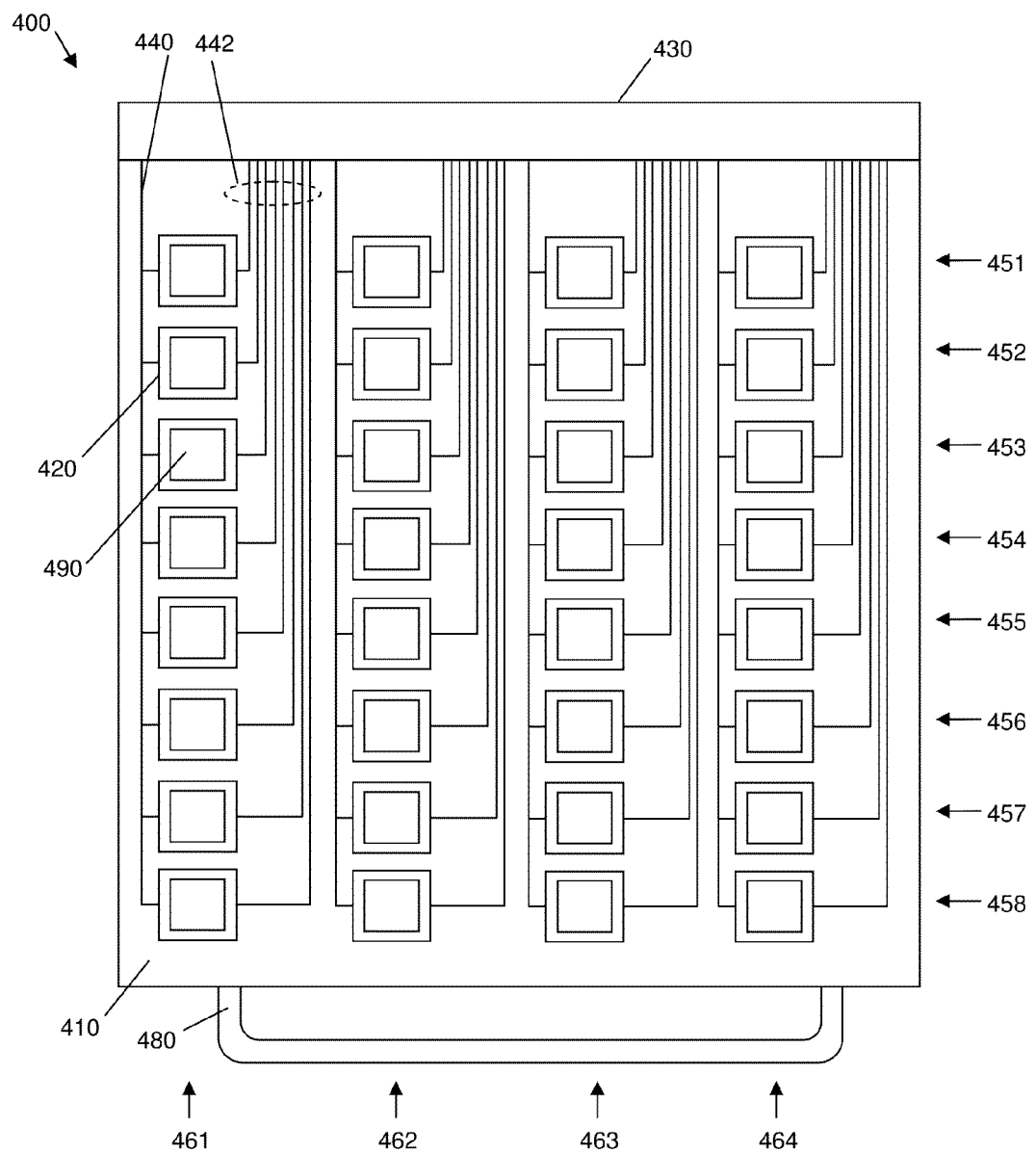
FIG. 4 is a top view of a calibration board with a plurality of transducer-including devices installed in sockets of the calibration board, in accordance with an example embodiment.

FIG. 4 is a top view of a calibration board 400 (e.g., calibration board 370, FIG. 3) with a plurality of transducer-including devices 490 (e.g., transducer-including devices 372, FIG. 2) installed in a plurality of sockets 420 of the calibration board 400, in accordance with an example embodiment. Calibration board 400 includes a substrate 410, a plurality of sockets 420 coupled to the substrate 410, an edge connector 430 (e.g., connector 344, FIG. 3), a plurality of conductors 440, 442 between the sockets 420 and the connector 430, and a handle 480, in an embodiment. Although handle 480 is not essential, handle 480 may be included for the convenience of a human operator who is responsible for inserting calibration board 400 into a device handling system (e.g., device handling system 350, FIG. 3) and removing calibration board 400 from the device handling system.

Each socket 420 is configured to hold a transducer-including device 490, and to provide for electrical connection between the transducer-including device 490 and conductors 440, 442. More specifically, each socket 420 is designed so that, when a transducer-including device 490 is installed in the socket 420, contacts of the transducer-including device 490 (e.g., contacts 290-295, FIG. 2) align and physically connect with corresponding contacts (not illustrated) of the socket 420. According to an embodiment, calibration board 400 includes an array of sockets 420 arranged in rows 451, 452, 453, 454, 455, 456, 457, 458 and columns 461, 462, 463, 464. Although an array of sockets with eight rows 451-458 and four columns 461-464 is shown in FIG. 4, it is to be understood that alternate embodiments of calibration boards may include more or fewer rows and/or columns of sockets, including as few as a single row or a single column. Accordingly, although a calibration board 400 configured to hold 32 transducer-including devices 490 is shown in FIG. 4, it is to be understood that a calibration board may be designed to hold more or fewer transducer-including devices. Either way, according to an embodiment, each socket 420 may be identified by the row and column in which it is positioned. Alternatively, each socket 420 may be identified by some other unique identifier that enables a calibration system (e.g., calibration control module 310 of calibration system 300, FIG. 3) to store information (e.g., error information, state information, transducer data, calibration coefficients, and so on) relating to a particular transducer-including device 490 installed in a particular socket 420 using the unique socket identifier as a key.

Each conductor 440, 442 extends between a socket contact and a conductive element of connector 430 (e.g., a pin or pin receptacle, which is configured to mate with a corresponding pin receptacle or pin, respectively, of another connector, such as connector 342, FIG. 3). Certain ones of conductors 440 may be connected in parallel to corresponding contacts of sockets 420 within a given column 461-464 or with corresponding contacts of all sockets 420 of the calibration board 400. These conductors 440 may be referred to herein as "multiple socket conductors" 440. According to an embodiment, a signal or voltage reference conveyed on a multiple socket conductor 440 is conveyed simultaneously to all sockets 420 to which the parallel conductor 440 is coupled (and to all transducer-including devices 490 installed in those sockets 420). Certain other conductors 442 may be connected to a contact of only one socket 420. These conductors 442 may be referred to herein as "single socket conductors" 442. According to an embodiment, a signal conveyed on a single socket conductor 442 is conveyed to or by only a single transducer-including device 490 installed in a single socket 420. In FIG. 4, only one multiple socket conductor 440 and one single socket conductor 442 are shown as being coupled to each socket 420 to avoid cluttering the Figure. However, according to various embodiments, a plurality of multiple socket conductors 440 and/or single socket conductors 442 may be coupled to each socket 420, with each conductor 440, 442 being coupled to a particular socket contact (corresponding to a particular contact of a transducer-including device 490). According to an embodiment, voltage references corresponding to power and ground are conveyed using multiple socket conductors 440. Other signals may be conveyed using multiple socket conductors 440 or single socket conductors 442, as will be described in more detail below.

Figure 6:
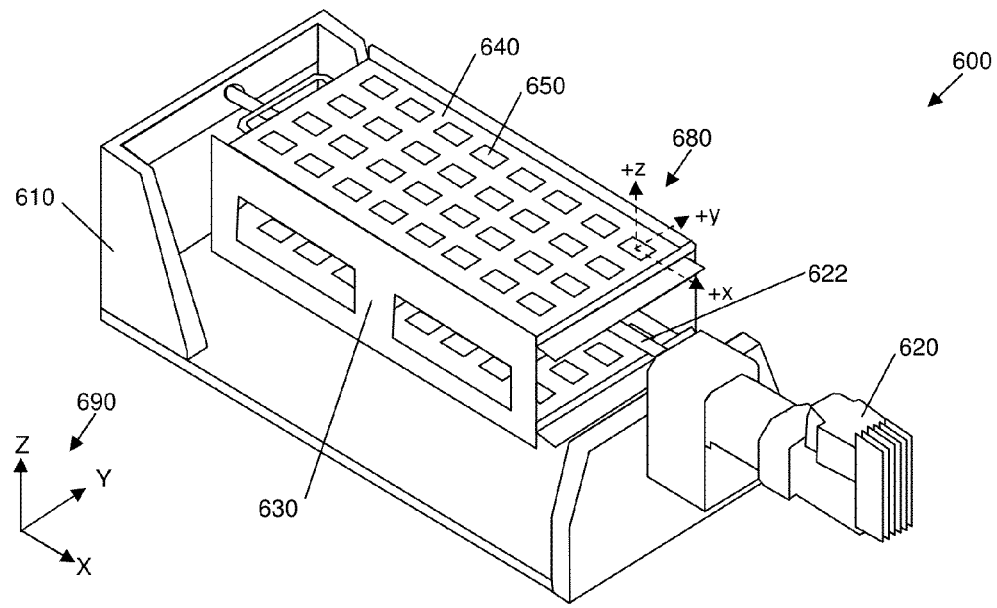
FIG. 6 is an external view of a device handling system, which includes a board support structure that is oriented in a first orientation with respect to a fixed coordinate system, in accordance with an example embodiment.

Referring again to FIG. 3, according to an embodiment, the device handling system 350 includes a single motor 356 coupled to the board support structure 354 in a manner that enables the motor 356 to rotate the board support structure 354 around one axis (e.g., X-axis of fixed coordinate system 690, FIG. 6). In another embodiment, the device handing system 350 includes multiple motors 356 coupled to the board support structure 354 in a manner that enables the motors 356 to rotate the board support structure 354 around multiple axes (e.g., multiple orthogonal axes of a fixed coordinate system). Although much of the description herein discusses an embodiment in which a single motor 356 rotates the board support structure 354 around a single axis, those of skill in the art would understand, based on the description herein, how to modify system 300 so that the board support structure 354 could be rotated around multiple axes.

As mentioned above, motor(s) 356 are controlled by signals from calibration controller 310 (e.g., signals conveyed via communication structure 330). Communication between calibration controller 310 and motor(s) 356 may be one-way (e.g., calibration controller 310 may send signals or commands to motor(s) 356 to rotate a specified number of degrees, for a specified time period, and/or at a specified rate) or communications may be bi-directional (e.g., motor(s) 356 also may send feedback to calibration controller 310 indicating an angular orientation, a rate of rotation, and so on). In addition, calibration controller 310 communicates with transducer-including devices 372 (e.g., via communication structure 330) to cause transducer-including devices 372 to generate transducer data and, in an embodiment, to calculate and store calibration coefficients. Communication between calibration controller 310 and transducer-including devices 372 is bi-directional, in an embodiment. More specifically, as will be described later, calibration controller 310 may send various commands to the transducer-including devices 372 (e.g., via parallel conductors of communication structure 330, where parallelism is indicated with a forward slash in FIG. 3), and the transducer-including devices 372 may send signals to calibration structure 310 indicating certain events and/or data. The transducer-including devices 372 also may receive voltage references (e.g., power and ground) through one or more conductive paths (e.g., through communication structure 330 and/or from voltage references supplied by the device handling system 350).

In an embodiment, calibration controller 310 includes a user interface 312, a display device 314, memory 316, a calibration control module 318, a motor control module 320, and a transducer-including device interface 322. The various components of calibration controller 310 may communicate over a common bus structure 324, as shown in FIG. 3, or may communicate over multiple busses and/or other conductive paths. In addition, although the various components of calibration controller 310 may be housed together in a single housing, the various components of calibration controller 310 alternatively may be housed in multiple housings, with appropriate connectors between the various components.

The user interface 312 includes one or more devices, which enable a human operator to interact with the system 300. For example, the user interface 312 may include any combination of a key panel, a button panel, a keyboard, a cursor control device, a touch sensitive screen, a speaker, a microphone, and so on. Display device 314 enables the system 300 to provide the human operator with information (e.g., prompts, data, calibration process status updates, and so on). Through user interface 312 and display device 314, the human operator may initiate, control, and monitor a calibration process. Alternatively, initiation, control, and monitoring of a calibration process may be performed using an automated system.

Memory 316 may include any combination of RAM, ROM, or other type of memory. According to an embodiment, memory 316 may be used to store a variety of types of persistent and temporary information or data, such as executable software instructions (e.g., instructions associated with implementation of the various embodiments), data, system parameters, and so on.

Calibration control module 318 is configured to execute the software associated with implementation of the calibration process, including controlling the motor control module 320 and communicating with the transducer-including devices 372 via device interface 322. For example, according to an embodiment, calibration control module 318 is configured to cause motor control module 320 to send motor control signals to the motor(s) 356 to cause the motors to move the board support structure 354 through a series of orientations with respect to one or more axes (and thus to move the calibration board 370 and transducer-including devices 372 through the series of orientations). In addition, calibration control module 318 is configured to send calibration control signals to the transducer-including devices 372 via the device interface 322 and communication structure 330, in order to cause the transducer-including devices 372 to generate transducer data while the device support structure 354 is in or moving toward each of the series of orientations. Each of these processes will be described in more detail below.

Many of the embodiments discussed herein pertain to calibrating a transducer-including device (e.g., device 200, 372, FIGS. 2, 3) that includes a microcontroller (e.g., microcontroller 280, FIG. 2) and internal memory (e.g., memory 282, FIG. 2), where the microcontroller calculates the calibration coefficients, and the calibration coefficients are stored in the internal memory. In an alternate embodiment, a transducer-including device may not include a microcontroller that calculates the calibration coefficients. In such an embodiment, the transducer-including device may instead provide electronic signals that convey the transducer measurements to the system 300 (e.g., to a microcontroller 360 of the device handling system 350 or to calibration control module 318 of the calibration controller 310), and those components of the system 300 may calculate the calibration coefficients. In another alternate embodiment, a transducer-including device does not store the calibration coefficients in internal memory. Instead, the system 300 may store the calibration coefficients (e.g., in memory 316 of the calibration controller 310), and the calibration coefficients later may be loaded into the memory of a device (e.g., device 1100, FIG. 11) into which a transducer-including device ultimately is incorporated. Accordingly, although various embodiments discussed herein are used to calibrate "intelligent" transducer-including devices (e.g., devices that include a microcontroller and internal memory), other embodiments may be used to determine calibration coefficients for "unintelligent" transducer-including devices (e.g., devices that do not include a microcontroller and/or internal memory).

In yet another alternate embodiment, all or portions of the calibration controller 310 may be coupled to the board support structure 354. For example, in an embodiment, circuit board 358 may have components corresponding to all or portions of the calibration controller 310. More particularly, those components may be configured to implement all or portions of the processes performed by user interface 312, display 314, memory 316, calibration control module 318, motor control module 320, and/or device interface 322. In a further embodiment, the portions of the calibration controller 310 that are coupled to the board support structure 354 (e.g., that are coupled to circuit board 358) may communicate wirelessly with portions of the calibration controller 310 that are not coupled to circuit board 358. Such embodiments may be particularly useful, for example, when it is desired to rotate the board support structure 354 in a manner in which physical conductors of communication structure 330 (e.g., cables) otherwise may become undesirably wound up (e.g., when it is desired to rotate the board support structure 354 through multiple full rotations, such as when calibrating gyroscopes 220, FIG. 2).

Figure 5:
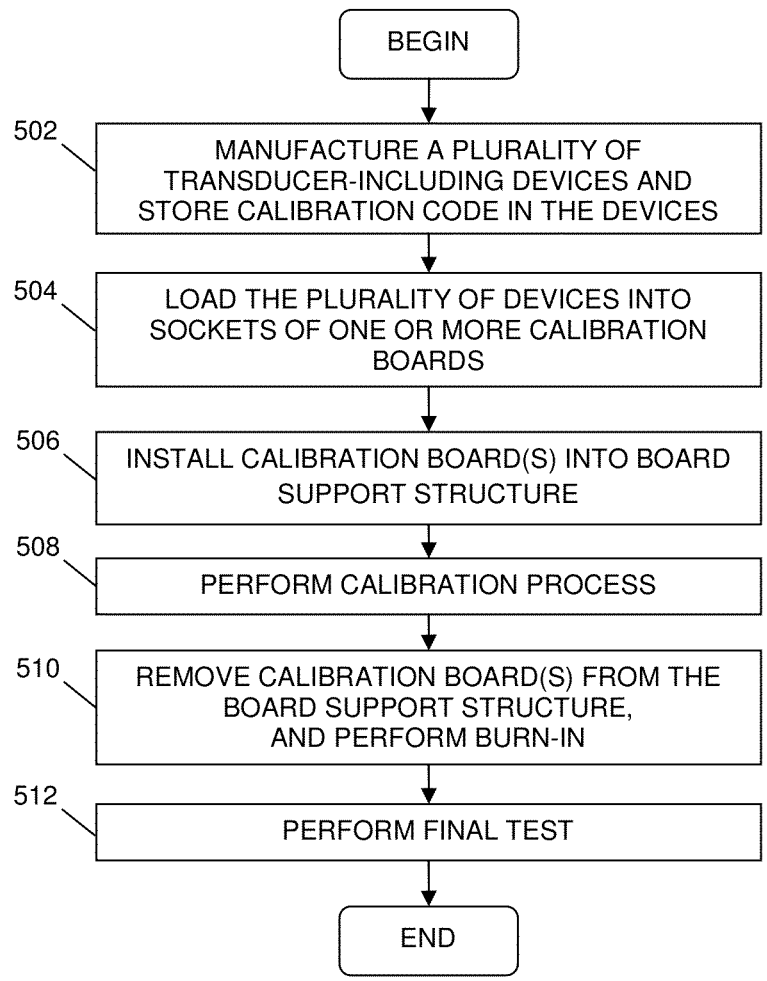
FIG. 5 is a flowchart of a method for manufacturing and calibrating a plurality of transducer-including devices, in accordance with an example embodiment.

The calibration system 300 may be used to calibrate a plurality of transducer-including devices 372 at various points in a manufacturing process. For example, FIG. 5 is a flowchart of a method for calibrating a plurality of transducer-including devices at a particular point in a manufacturing process, in accordance with an example embodiment. It is to be understood that a calibration system (e.g., calibration system 300, FIG. 3) alternatively may be used at a different point in a manufacturing process than that described in conjunction with FIG. 5.

In any event, according to an embodiment, the method may begin by manufacturing a plurality of transducer-including devices (e.g., transducer-including devices 100, 200, 372, 490, FIGS. 1-4), in block 502. The transducer-including devices essentially are fully packaged devices (e.g., overmolded or air cavity packages) with exposed contacts (e.g., contacts 108, FIG. 1). Once manufactured, firmware instructions (or "code") associated with performing a calibration process in accordance with an embodiment may be stored in each device (e.g., into memory 282, FIG. 2). During performance of the calibration process discussed later, the device's microcontroller (e.g., microcontroller 280, FIG. 2) may retrieve and execute the stored calibration code. For example, the calibration code may include various code segments corresponding to the device-performed portions of the overall calibration processes of FIGS. 8 and 9 or the calibration sub-processes of FIGS. 10-12. In block 504, the transducer-including devices are loaded into sockets (e.g., sockets 420, FIG. 4) of one or more calibration boards (e.g., calibration board 400, FIG. 4). For example, the devices may be loaded into the sockets by hand, using automatic pick-and-place equipment, or using some other technique.

In block 506, a human operator (or automated board-handling system) installs the calibration board(s) into a board support structure of a device handling system (e.g., into board support structure 354 of device handling system 350, FIG. 3). For example, as discussed previously, an edge connector of the calibration board (e.g., edge connector 344, 430, FIGS. 3, 4) may be aligned with a corresponding connector of a device handling system (e.g., connector 342, FIG. 3), and the connectors may be pushed together until electrical connection is established between the connectors' conductive features.

According to an embodiment, the board support structure is coupled with a base (e.g., base 352, FIG. 3) and with one or more motors (e.g., motors 356, FIG. 3), which are configured to support the board support structure and to rotate the board support structure around one or more axes, respectively. For example, FIG. 6 is an external view of a device handling system 600, which includes a base 610, a motor 620, and a board support structure 630 that is oriented in a first orientation with respect to a fixed coordinate system 690 (e.g., a coordinate system that is fixed with respect to base 610), in accordance with an example embodiment. In the embodiment illustrated in FIG. 6, board support structure 630 is configured to hold two calibration boards 640, and each calibration board 640 may include a plurality of transducer-including devices 650 loaded into sockets of the calibration boards 640. In other embodiments, a board support structure may be configured to hold a single calibration board or more than two calibration boards. Either way, in the orientation of FIG. 6, the device-fixed axes 680 of each transducer-including device 650 are angularly offset from the corresponding axes of the fixed coordinate system 690 (although in the orientation of FIG. 6, the angular offsets are approximately zero degrees).

The calibration boards 640 may be coupled to the board support structure 630 using corresponding connectors. For example, an edge connector (e.g., connector 344, 430, FIGS. 3, 4) at a first end of each calibration board 640 may be inserted into a corresponding connector (e.g., connector 342, FIG. 3) that is coupled to the board support structure 630. The connectors and other mechanical features (e.g., slots, ledges, and so on) of the calibration boards 640 and/or the board support structure 630 hold the calibration boards 640 in a fixed position with respect to the board support structure 630.

Conversely, the board support structure 630 is coupled to the base 610 in a manner that enables the board support structure 630 to be rotated by motor 620 around an axis of the fixed coordinate system 690. According to an embodiment, motor 620 is coupled to base 610, and a shaft 622 extending from motor 620 is coupled to the board support structure 630. The motor 620 may be controlled (e.g., by calibration controller 310, FIG. 3) to rotate the shaft 622 and, thus, to rotate the board support structure 630, calibration boards 640, and transducer-including devices 650. In the example of FIG. 6, for example, motor 620 may be controlled to rotate the board support structure 630, calibration boards 640, and transducer-including devices 650 around the X-axis of coordinate system 690. As mentioned previously, according to other embodiments, a system alternatively may include one or more motors that may be controlled to rotate a board support structure and/or calibration board around multiple fixed axes.

Referring again to FIG. 5, in block 508, a calibration process for the transducer-including devices is then performed. As will be discussed in more detail in conjunction with FIGS. 8-10, the calibration process essentially includes a calibration controller (e.g., calibration controller 310, FIG. 3) causing the motor(s) (e.g., motors 356, FIG. 3) to rotate the board support structure through a series of orientations, causing the transducer-including devices to collect transducer data while in the various orientations (or while being moved between orientations) and, ultimately, causing the transducer-including devices to select calibration coefficients (e.g., gain and offset values or codes) based on the collected transducer data. In other words, as discussed previously, the calibration controller causes the transducer-including devices (e.g., devices 650, FIG. 6) and their corresponding device-fixed axes (e.g., axes 680, FIG. 6) to be rotated with respect to a fixed coordinate system (e.g., fixed coordinate system 690, FIG. 6). In addition, the calibration controller communicates with the transducer-including devices to cause the devices to produce transducer data and to calculate calibration coefficients, in an embodiment. For example, referring again to FIG. 6, the calibration controller (not shown in FIG. 6) may communicate with the transducer-including devices 650 to cause the transducer-including devices 650 to generate transducer data while the devices 650 are in the orientation shown in FIG. 6. Assuming that the only significant force is a gravitational force in the −Z direction, for example, a +1 G acceleration due to gravity would be exerted on the transducer-including devices 650 along the device-fixed z-axis, and the transducer data (e.g., accelerometer and/or gyroscope data) produced by the devices 650 would have corresponding values. As mentioned previously, the system also may include a magnetic field generator (not illustrated) configured to produce a magnetic field that passes through the board support structure 630 (e.g., with the magnetic field being strongest along the Z-axis), and the transducer data (e.g., magnetometer data) produced by the devices 650 would have corresponding values.

Figure 7:
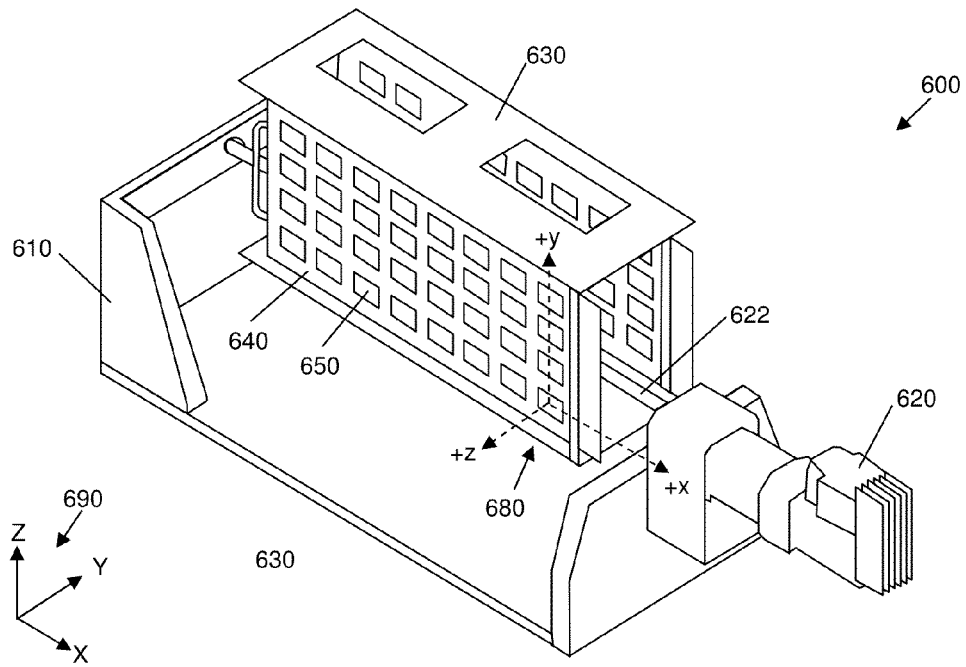
FIG. 7 is an external view of the device handling system of FIG. 6, with the board support structure oriented in a second orientation with respect to the fixed coordinate system, in accordance with an example embodiment.

According to an embodiment, once a transducer-including device 650 has produced transducer data in a particular orientation (e.g., the orientation shown in FIG. 6), the transducer-including device 650 may send an indication to the calibration controller that the measurement (or data collection) process has been completed for that orientation. The calibration controller may then send motor control signals to motor 620, to cause the motor 620 to rotate the board support structure 630 to a next orientation in the sequence. For example, FIG. 7 is an external view of the device handling system 600 of FIG. 6, with the board support structure 630 oriented in a second orientation with respect to the fixed coordinate system 690, in accordance with an example embodiment. More specifically, via motor 620, the board support structure 630 has been rotated approximately 90 degrees around the X-axis of the fixed coordinate system 690. In this orientation, a +1 G acceleration due to gravity would be exerted on the transducer-including devices 650 along the device-fixed y-axis. In this orientation, the calibration controller may cause each transducer-including device 650 again to produce transducer data, and the transducer-including device 650 again may send an indication to the calibration controller that the measurement process in that orientation has been completed. This process may continue until the calibration controller has caused the board support structure 630 to be rotated through a series of desired orientations. When transducer data in the final orientation of the series has been collected, the transducer-including devices 650 may calculate calibration coefficients (e.g., gain and offset values or codes). The calibration coefficients may be stored in memory of the devices (e.g., memory 282, FIG. 2). In alternate embodiments, the transducer-including devices 650 may not calculate and/or store calibration coefficients, in which case these processes would be performed elsewhere (e.g., by microcontroller 360, calibration control module 318, and/or memory 316, FIG. 3).

Referring again to FIG. 5, once the calibration process is complete, the calibration board(s) may be removed from the device handling system, in block 510. The loaded calibration board(s) may then be used to perform other portions of the manufacturing process (e.g., both calibration and additional processes may be performed without removing the transducer-including devices from the calibration board). For example, according to an embodiment, a burn-in process may thereafter be performed with the device-loaded calibration boards. During a burn-in process, for example, the calibration boards may be electrically connected (via connectors 344, 430, FIGS. 3, 4) to corresponding connectors in a chamber. At an elevated temperature and/or pressure, the transducer-including devices may make produce and store additional sensor measurements, verify that the measurements are within expected ranges, and produce indications of the results. Other processes also or alternatively may be performed during a burn-in process.

Subsequently, in block 512, a final test process may be performed. During the final test process, for example, the devices may be tested to ensure that the transducers are still functioning properly. In addition, for embodiments of transducer-including devices that include internal memory (e.g., memory 282 of device 200, FIG. 2), data stored within the device may be read out and evaluated to ensure that the data falls within pre-specified ranges. Upon completion of the final test process, the method may end.

Figure 8:
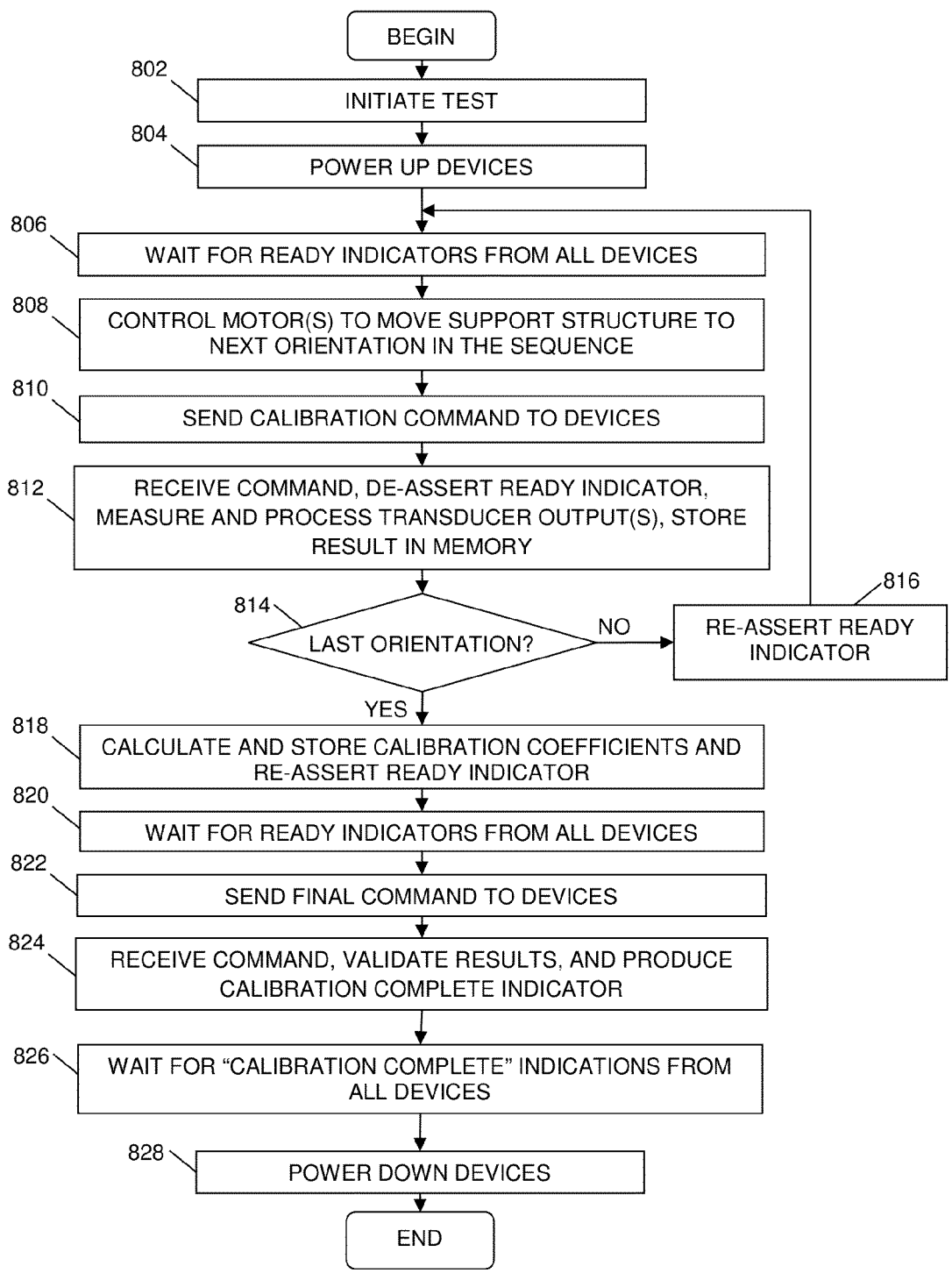
FIG. 8 is a flowchart of a method for calibrating a plurality of transducer-including devices, in accordance with an example embodiment.

More detailed example embodiments of calibration processes (e.g., block 508, FIG. 5) will now be given in conjunction with FIGS. 8-12. More specifically, FIG. 8 is a flowchart of a method for calibrating a plurality of transducer-including devices, in accordance with an example embodiment. The method may begin, in block 802, when a human operator causes the calibration process to be initiated (e.g., by pressing a "start" button of the calibration controller user interface 312, FIG. 3). Alternatively, the calibration process may be started automatically (e.g., once the calibration board has been properly loaded into the board support system). Either way, upon initiation of the process, the calibration controller may cause the transducer-including devices to be powered up, in block 804.

According to an embodiment, the calibration controller may then wait to receive "ready" indications from each of the transducer-including devices on a calibration board, in block 806. For example, referring also to FIGS. 3 and 4, each transducer-including device 490 on calibration board 400 may produce a signal at one of its contacts (e.g., one of contacts 292-295, FIG. 2), which corresponds to the ready indicator (e.g., the device may establish a relatively-high voltage at the contact). According to an embodiment, the signal corresponding to the ready indicator is conveyed via a socket contact and a single-socket conductor 442 to the calibration board connector 430, and ultimately through the communication structure 330 to the calibration controller 310. In alternate embodiments, the transducer-including device may send a message (e.g., a message packet) to the calibration controller with a payload that indicates that the device is ready, or the device may produce some other type of ready indicator. When the calibration controller has not received a ready indicator from a particular device within a timeout period, the calibration controller may log an error for that device (e.g., the calibration controller may log an error corresponding to a particular socket).

Once the calibration controller has received the ready indicator from all transducer-including devices on a calibration board (and/or has logged errors for non-responsive devices), in block 808, the calibration controller may cause the calibration board to be placed in a first orientation. More specifically, for example, the calibration controller may provide motor control signals (e.g., via motor control module 320), which cause the motor(s) of the device handling system (e.g., motor(s) 356) to move the board support structure, calibration board, and devices (e.g., board support structure 354, calibration board 370, and devices 372) to a first orientation in a pre-defined sequence of orientations. The motor(s) may provide feedback to the calibration controller during this process (e.g., indicating motor position, rate of rotation, and so on). If the board support structure already is in the first orientation at the beginning of the calibration process, the first iteration of block 808 may be bypassed.

In block 810, the calibration controller may then send a "calibration" command to the devices. For example, according to an embodiment, the calibration controller may send the calibration command to all devices on the calibration board in parallel. According to an embodiment, the calibration command is conveyed by the calibration controller 310 via the communication structure 330 and the calibration board connector 430 to multiple socket conductor(s) 440 of the calibration board 400, which in turn convey the signals to the sockets 420 and the transducer-including devices 490.

According to an embodiment, the calibration command indicates to the transducer-including device (or more specifically to microcontroller 280, FIG. 2) the orientation that the device is in, and/or from which of multiple transducers transducer data should be collected. For example, when testing a multi-axis accelerometer of the device, the calibration command may indicate from which of multiple accelerometers (e.g., which of accelerometers 212-214, FIG. 2) data should be collected. If the orientation is expected to produce a maximum acceleration (e.g., about +1 G of acceleration due to gravity) along the device's z-axis (e.g., z-axis 114, FIG. 1), for example, the calibration command may indicate that that transducer data should be collected from the z-axis accelerometer (e.g., z-axis accelerometer 214, FIG. 2). Accordingly, the device may select the output from that accelerometer (e.g., microcontroller 280 may control MUXs 216, 250 to produce an output from z-axis accelerometer 214, FIG. 2).

Conversely, for example, when testing a multi-axis magnetometer of the device, the calibration command may indicate from which of multiple magnetometers (e.g., which of magnetometers 232-234, FIG. 2) data should be collected. If the orientation is expected to produce a maximum magnetic field along the device's y-axis (e.g., y-axis 112, FIG. 1), for example, the calibration command may indicate that transducer data should be collected from the y-axis magnetometer (e.g., y-axis magnetometer 233, FIG. 2). Accordingly, the device may select the output from that magnetometer (e.g., microcontroller 280 may control MUXs 236, 250 to produce an output from y-axis magnetometer 233, FIG. 2).

When testing a gyroscope of the device, blocks 808 and 810 may be performed together. In other words, according to an embodiment, the calibration controller may send the calibration command to the device while the calibration board is being rotated, so that transducer data from the gyroscope may be collected during the rotation operation. For example, when testing a multi-axis gyroscope of the device, the calibration command may indicate from which of multiple gyroscopes (e.g., which of gyroscopes 222-224, FIG. 2) data should be collected. If the rotation is around the device's x-axis (e.g., x-axis 110, FIG. 1), for example, the calibration command may indicate that transducer data should be collected from the x-axis gyroscope (e.g., x-axis gyroscope 222, FIG. 2). Accordingly, the device may select the output from that gyroscope (e.g., microcontroller 280 may control MUXs 226, 250 to produce an output from x-axis gyroscope 222, FIG. 2).

In block 812, upon receiving the calibration command, each transducer-including device may first de-assert the ready indicator, thus signaling to the calibration controller that the transducer-including device is collecting transducer data and, in some embodiments, storing and/or processing the transducer data (e.g., in embodiments in which the transducer-including device includes memory, such as memory 282, and/or a microcontroller, such as microcontroller 280, FIG. 2). As indicated above, the transducer-including device may collect transducer data from one or more transducers associated with the received command. In an embodiment in which the transducer-including device includes a memory (e.g., memory 284, FIG. 2), the transducer-including device may store the transducer data and transducer data processing results in the memory in a manner in which it is correlated with the appropriate transducer, transducer type, and/or sensing axis (or axes).

According to an embodiment, when the transducer-including device has completed the transducer data collection, processing, and storage processes, and when the current device orientation does not correspond to a last orientation in the pre-defined sequence of orientations (as indicated by decision block 814), the transducer-including device may re-assert the ready indicator, in block 816. Re-assertion of the ready indicator indicates to the calibration controller that the transducer-including device is ready to be re-oriented in order to collect, process, and store additional transducer data. The method then iterates as shown.

Conversely, when the transducer-including device has completed the transducer data collection, processing, and storage processes, and when the current device orientation corresponds to a last orientation in the pre-defined sequence of orientations (as indicated by decision block 814), the transducer-including device may calculate calibration coefficients (e.g., gain and/or offset values or codes for each sensing axis) using the stored transducer data, in block 818. Various methods for calculating the calibration coefficients may be used, in various embodiments. Either way, according to an embodiment, the device may store the calibration coefficients for each sensing axis and sensor type in internal memory (e.g., memory 282, FIG. 2) for later use during normal operation of the device. In addition, the device may re-assert the ready indicator, indicating to the calibration controller that the transducer-including device has completed collection of transducer data in the final orientation, and has calculated and stored calibration coefficients.

According to an embodiment, the calibration controller waits to receive the final ready indicators from all transducer-including devices on the calibration board, in block 820. Once the calibration controller has received the ready indicator from all transducer-including devices (and/or has logged errors for non-responsive devices), in block 822, the calibration controller may send a final command to the transducer-including devices (e.g., in parallel). According to an embodiment, when a transducer-including device receives the final command from the calibration controller, the device may validate results, in block 822 (e.g., determine whether the calibration coefficients fall within acceptable ranges). When the device has completed the validation process, the device may produce a "calibration complete" indicator, in block 824. For example, the calibration complete indicator may include toggling the voltage level (e.g., from a relatively high voltage to a relatively low voltage) on a contact (e.g., one of contacts 292-295, FIG. 2) at a particular frequency (e.g., 50 hertz or some other frequency). Alternatively, the calibration complete indicator may be some other type of signal to the calibration controller.

In block 826, the calibration controller waits to receive the calibration complete indicators from all transducer-including devices on the calibration board. When the calibration controller has not received a calibration complete indicator from a particular device within a timeout period, the calibration controller may log an error for that device (e.g., the calibration controller may log an error corresponding to a particular socket). Once the calibration controller has received the calibration complete indicator from all transducer-including devices on a calibration board (and/or has logged errors for non-responsive devices), the calibration controller may power down the devices, in block 828, and the method may end (e.g., proceed to block 510 of FIG. 5).

Figure 9:
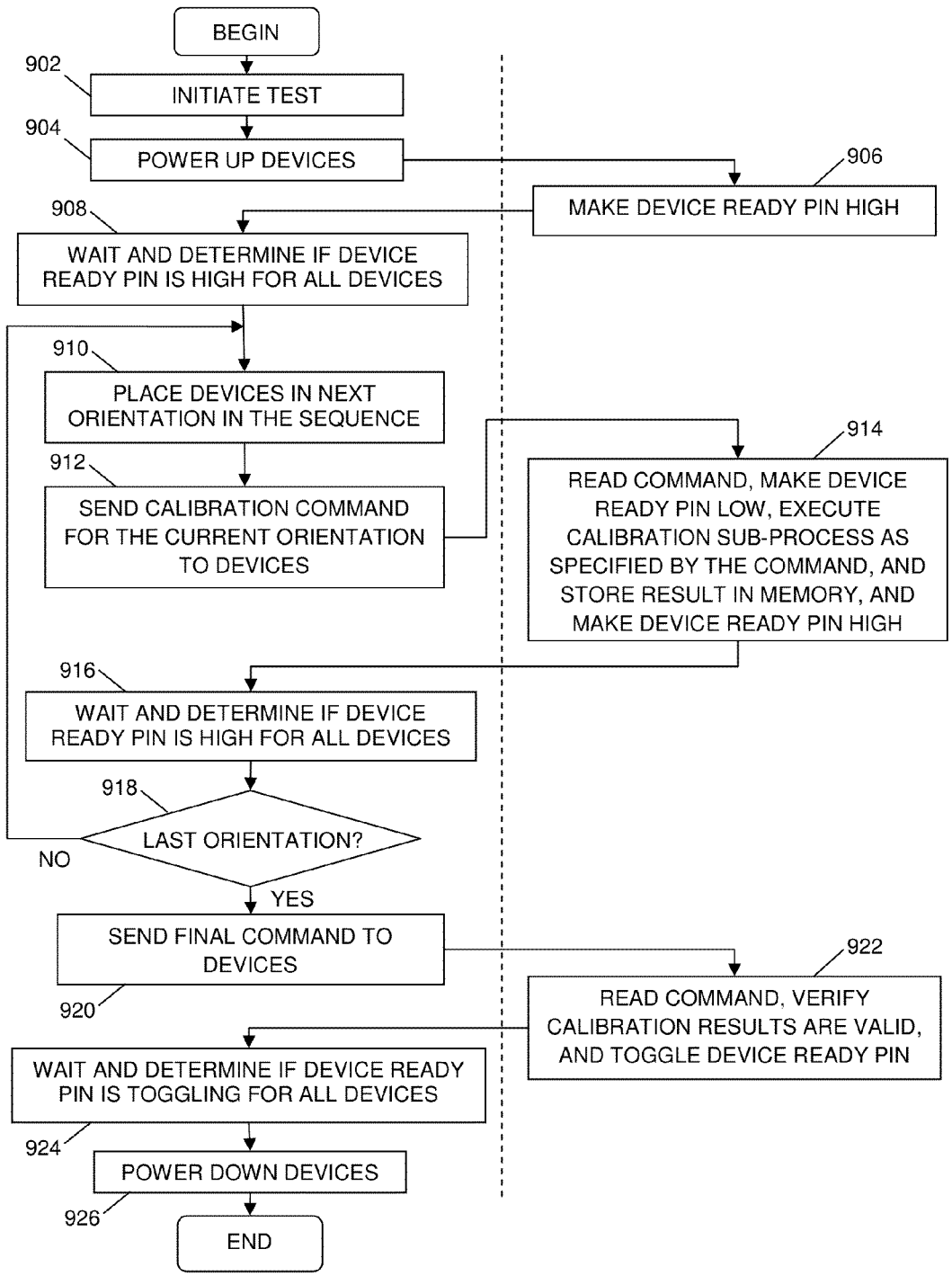
FIG. 9 is a flowchart of a method for calibrating a plurality of transducer-including devices, in accordance with another example embodiment.

FIG. 9 is a flowchart of a method for calibrating a plurality of transducer-including devices, in accordance with another example embodiment. The embodiment of the calibration method depicted in FIG. 9 is similar to the embodiment of the calibration method depicted in FIG. 8, with certain differences regarding some of the processes performed, and other differences regarding communication between a calibration controller (e.g., calibration controller 310, FIG. 3) and a transducer-including device (e.g., transducer-including device 200, 372, 490, FIGS. 2-4). It is to be understood that, in other embodiments, a calibration method may include a hybrid of processes and communication methods from the embodiments of FIGS. 8 and 9, and/or may include other differences that would occur to one of skill in the art based on the description herein. In FIG. 9, for enhanced understandability, processes performed by the calibration controller are shown on the left side of the dashed line that extends vertically through FIG. 9, and processed performed by a transducer-including device are shown on the right side of the dashed line.

The method may begin, in block 902, when a human operator causes the calibration process to be initiated (e.g., by pressing a "start" button of the calibration controller user interface 312, FIG. 3). Alternatively, the calibration process may be started automatically (e.g., once the calibration board has been properly loaded into the board support system). Either way, upon initiation of the process, the calibration controller may cause the transducer-including devices to be powered up, in block 904. According to an embodiment, once powered up, each transducer-including device may check a "calibration flag" (e.g., stored in memory 282, FIG. 2 or in a register or other memory location of the device) to determine whether or not a calibration process should be performed by executing the calibration code previously stored in the device. When the calibration flag indicates that the calibration process should be performed, the process may continue as shown in FIG. 9. Otherwise, the device may perform some other process (e.g., processes associated with burn-in or some other operation). In an alternate embodiment, a calibration flag is not implemented, and accordingly, the calibration process may proceed without checking such a flag.

In block 906, once the power up sequence has been completed, the transducer-including device may provide a "ready indicator" on one of its contacts (e.g., one of contacts 292-295, FIG. 2, referred to below as a "device ready pin"), which indicates to the calibration controller that the transducer-including device is ready to receive a calibration command from the calibration controller. For example, providing the ready indicator may include the transducer-including device establishing a voltage at the device ready pin that has a first voltage level associated with a first logic state (e.g., a relatively high level). In other words, the transducer-including device may make the device ready pin high to indicate that the transducer-including device is ready to receive a calibration command from the calibration controller. In an alternate embodiment, the "first voltage level" associated with the ready indicator may be a relatively low level. Either way, referring also to FIGS. 3 and 4, this indication may be conveyed from the transducer-including device 490 to the calibration controller through a socket contact and a single-socket conductor 442 to the calibration board connector 430, and ultimately through the communication structure 330 to the calibration controller 310, in an embodiment.

According to an embodiment, the calibration controller may then wait to receive ready indicators from each of the transducer-including devices on the calibration board, in block 908. More specifically, the calibration controller may determine whether or not the device ready pin has been set high for each of the devices on the calibration board by determining the voltage on each single-socket conductor (e.g., single socket conductors 442) coupled to each device ready pin, in an embodiment. When the calibration controller has not received a ready indicator from a particular device within a timeout period (e.g., 0.25 seconds from initiation of power up, or some other timeout period), the calibration controller may log an error for that device (e.g., indicating the socket or device identifier and the point in the calibration process when the device became non-responsive). According to an embodiment, devices that fail to provide the ready indicator within the timeout period are thereafter excluded from subsequent portions of the calibration process. In addition, in an embodiment, the calibration controller also may display an indication of the location of the non-responsive device on the calibration board (e.g., via display 314, FIG. 3), so that the human operator may thereafter take appropriate action (e.g., reject the device and/or mark the device as being defective).

Once the calibration controller has received the ready indicator from all transducer-including devices on a calibration board (and/or has logged errors for non-responsive devices), in block 910, the calibration controller may place the transducer-including devices in a first orientation, if they are not already in the first orientation. More specifically, for example, the calibration controller may provide motor control signals (e.g., via motor control module 320), which cause the motor(s) of the device handling system (e.g., motor(s) 356) to move the board support structure, calibration board, and devices (e.g., board support structure 354, calibration board 370, and devices 372) to a first orientation in a pre-defined sequence of orientations. The motor(s) may provide feedback to the calibration controller during this process (e.g., indicating motor position, rate of rotation, and so on). If the board support structure already is in the first orientation at the beginning of the calibration process, the first iteration of block 910 may be bypassed.

In block 912, the calibration controller may then send a calibration command to the devices. For example, according to an embodiment, the calibration controller may send the calibration command to all devices on the calibration board in parallel. According to an embodiment, the calibration command is conveyed by the calibration controller 310 via the communication structure 330 and the calibration board connector 430 to multiple socket conductor(s) 440 of the calibration board 400, which in turn convey the signals to the sockets 420 and the transducer-including devices 490. For example, each calibration command may be a multi-bit command (e.g., 8 bits or some other number of bits), which the calibration controller clocks into each transducer-including device. Accordingly, one of the transducer-including device's contacts (e.g., one of contacts 292-295, FIG. 2, referred to below as a "serial command input pin") may be configured to receive serial data, and another of the transducer-including device's contacts (e.g., another one of contacts 292-295, FIG. 2, referred to below as a "serial clock pin") may be configured to receive a clock signal. The calibration board 400 may include first multiple socket conductor(s) 440 that connect to socket contacts associated with the serial command input pins of the transducer-including devices, and second multiple socket conductor(s) 440 that connect to socket contacts associated with the serial clock pins of the transducer-including devices. In other embodiments, the calibration board 400 may include single-socket conductors 442 that convey the calibration commands and/or clock signals (e.g., the calibration commands and/or clock signals are not necessarily conveyed to all devices simultaneously via the same conductors). In still other embodiments, the calibration controller and transducer-including devices may be configured to communicate calibration commands without the calibration controller providing a clock signal (e.g., each command may be preceded by a preamble (e.g., 0xF)). In still other embodiments, the calibration commands may be conveyed to the transducer-including devices as parallel signals (e.g., the transducer-including devices include parallel command input pins).

According to an embodiment, each calibration command indicates to the transducer-including device (or more specifically to microcontroller 280, FIG. 2) the orientation that the device is in, and/or from which of multiple transducers transducer data should be collected, and/or which of multiple possible calibration sub-processes the device should perform. For example, a calibration command of 81 hexadecimal (1000 0001 binary) may indicate that the transducer-including device has been placed in a first orientation, and that the transducer-including device should execute a particular calibration sub-process (e.g., a sub-process codified by instructions stored in memory 282, FIG. 2). Conversely, other calibration commands may indicate that the transducer-including device is in other orientations and/or that the transducer-including device should execute other calibration sub-processes. Flowcharts of methods corresponding to various calibration sub-processes will be described later in conjunction with FIGS. 10-12.

In block 914, each transducer-including device may read the calibration command provided on its serial command in pin. Once the command is read into the device, the device may provide an indication that the device is "busy" or "not ready." For example, providing the busy indication may include the transducer-including device establishing a voltage at the device ready pin that has a second voltage level associated with a second logic state (e.g., a relatively low level). In other words, the transducer-including device may make the device ready pin low to indicate that the transducer-including device is busy executing a command and/or otherwise is not ready to receive another calibration command from the calibration controller. In an alternate embodiment, the "second voltage level" associated with the busy indication may be a relatively high level.

The transducer-including device may then execute the calibration sub-process associated with the calibration command (e.g., processes in accordance with FIGS. 10-12, discussed later). For example, execution of a calibration sub-process may include the transducer-including device collecting, storing, and processing transducer data, and/or selecting and storing calibration coefficients. According to an embodiment, during and after execution of the calibration sub-process, data may be stored in internal memory of the transducer-including device (e.g., in memory 282, FIG. 2), including transducer measurements, values derived from multiple transducer measurements (e.g., averages of multiple measurements or other values), selected calibration coefficients (e.g., gain values, gain codes, offset values, and/or offset codes), and/or other data. In addition or alternatively, the data may be output by the device for processing and/or storage by the calibration controller. Once the transducer-including device has completed execution of the calibration sub-process, the device again may provide a ready indicator (e.g., by making the device ready pin high), indicating to the calibration controller that the device has completed the calibration sub-process and is ready to receive a next calibration command.

According to an embodiment, the calibration controller may wait to receive ready indicators from each of the transducer-including devices on the calibration board, in block 916. When the calibration controller has not received a ready indicator from a particular device within a timeout period (e.g., 0.25 seconds from sending the calibration command in block 912, or some other timeout period), the calibration controller may log an error for that device (e.g., indicating the socket or device identifier and the point in the calibration process when the device became non-responsive), and may exclude that device from subsequent portions of the calibration process. In addition, in an embodiment, the calibration controller also may display an indication of the location of the non-responsive device on the calibration board (e.g., via display 314, FIG. 3), so that the human operator may thereafter take appropriate action.

Once the calibration controller has received the ready indicator from all transducer-including devices on a calibration board (and/or has logged errors for non-responsive devices), the calibration controller may determine whether the devices are in their last orientation of the pre-defined sequence of orientations, as indicated by decision block 918. If not, the calibration controller may return to block 910, and repeat the process of placing the devices in the next orientation in the sequence (i.e., block 910), sending the appropriate calibration command to the devices (i.e., block 912), and waiting to receive the ready indicators from the devices (i.e., block 916), and the transducer-including devices may again perform a calibration sub-process associated with the received calibration command (i.e., block 914).

Conversely, when the current device orientation corresponds to the last orientation in the pre-defined sequence of orientations (as indicated by decision block 918), the calibration controller may send a final command to the devices, in block 920 (e.g., via the serial command input pins). In block 922, each transducer-including device reads in the final command, and performs a final process corresponding to the final command. For example, the final process may include a validity verification process in which the transducer-including device verifies the validity of the calibration results obtained and stored (e.g., in memory 282, FIG. 2) during the performance of the various calibration sub-processes (e.g., the sub-processes performed in conjunction with the various iterations of block 914). Verification of the validity of the calibration results may include, for example, ensuring that the transducer measurements stored for each orientation are different from previously stored default values (e.g., FFFF hexadecimal or some other value), indicating that the corresponding measurements were appropriately made and stored. In addition, verification of the calibration results may include ensuring that each calculated or chosen calibration coefficient (for each orientation) falls within a range of expected or acceptable values (e.g., that the gain value associated with a chosen gain code falls within an acceptable range of gain values, and that the offset value associated with a chosen offset code falls within an acceptable range of offset values).

Once the transducer-including device has completed the verification process, the device may provide a calibration complete indicator. For example, the device may provide the calibration complete indicator on the device ready pin. To differentiate the calibration complete indicator from the device ready indicator, the device may provide alternating voltage levels on the device ready pin, in an embodiment. For example, the device may cause the voltage level on the device ready pin to toggle at a pre-defined frequency (e.g., 50 hertz or some other frequency) when the verification process has determined that the calibration results are valid. Conversely, when the device has determined that the calibration results are not valid, the device either may refrain from producing the calibration complete indicator, or may produce a calibration complete indicator that toggles at a different pre-defined frequency (e.g., 100 hertz or some other frequency). In addition to providing the calibration complete indicator, the device may alter a calibration flag (e.g., in memory 282, FIG. 2 or in a register or other memory location) to indicate that the calibration process has been completed, and that the device should execute different code the next time that the device is powered up.

According to an embodiment, the calibration controller may wait to receive calibration complete indicators from each of the transducer-including devices on the calibration board, in block 924. More specifically, for example, the calibration controller may determine whether the voltage on each device ready pin is toggling at the pre-defined frequency associated with a successful verification process. When the calibration controller has not received a calibration complete indicator from a particular device within a timeout period (e.g., 0.25 seconds from sending the final command in block 920, or some other timeout period), or when the calibration controller receives an indication that the calibration results are not valid for a device, the calibration controller may log an error for that device (e.g., indicating the socket or device identifier and the failure of the verification process). In addition, in an embodiment, the calibration controller also may display an indication of the location of the unverified device on the calibration board (e.g., via display 314, FIG. 3), so that the human operator may thereafter take appropriate action.

Once the calibration controller has received the calibration complete indicator from all transducer-including devices on a calibration board (and/or has logged errors for unverified devices), the calibration controller may power down the devices, in block 926, and the method may end (e.g., proceed to block 510 of FIG. 5).

As discussed previously in conjunction with block 914 of FIG. 9, each calibration command may cause a transducer-including device to perform a specific calibration sub-process. FIGS. 10-12 are flowcharts of examples of three different calibration sub-processes, in accordance with various embodiments. It is to be understood that the sub-processes depicted in FIGS. 10-12 are just a few examples of different calibration sub-processes that could be performed, and a transducer-including device may be configured to perform more, fewer, or different calibration sub-processes in other embodiments. It should be further understood that some of the calibration sub-processes may use results of other calibration sub-processes. For example, according to an embodiment, the calibration sub-processes of FIGS. 10 and 11 are complementary. More particularly, for each device axis for which it is desired to calculate calibration coefficients (or for each "calibration axis"), one of the sub-processes may be performed when a known positive gravitational force (e.g., +1 G) is exerted on the device along the axis, and the other sub-process may be performed when a known negative gravitational force of the same magnitude (e.g., −1 G) is exerted on the device along the axis. For example, in such an embodiment, the sub-process of FIG. 10 would first be performed when the device is in a first orientation, and the sub-process of FIG. 11 subsequently would be performed when the device is in a second orientation (e.g., an orientation that is rotated 180 degrees with respect to the first orientation around an axis orthogonal to the calibration axis). As will be discussed below, the sub-process of FIG. 11 may use measurement averages previously calculated in conjunction with performing the sub-process of FIG. 10 to select a gain value (or code) and an offset value (or code) for a particular calibration axis.

Figure 10:
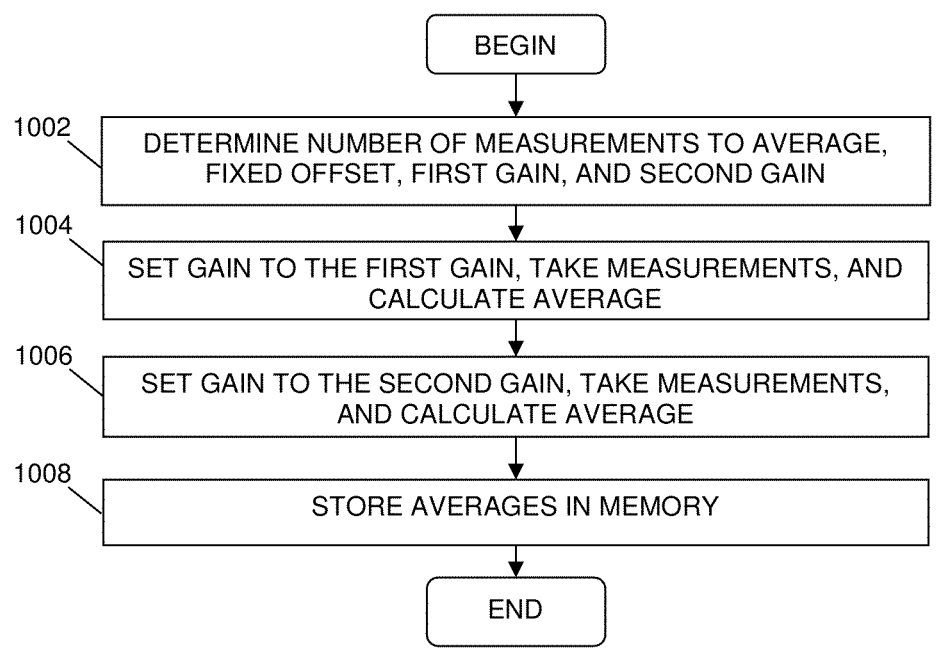
FIG. 10 is a flowchart of a calibration sub-process, in accordance with an example embodiment.

FIG. 10 is a flowchart of a first calibration sub-process, in accordance with an example embodiment. For example, the calibration sub-process of FIG. 10 could be performed (e.g., in conjunction with block 812 or 914, FIGS. 8, 9) by a transducer-including device (e.g., device 200, 372, 490, FIGS. 2-4) in response to having received a particular calibration command from a calibration controller (e.g., calibration controller 310, FIG. 3). In the calibration sub-process of FIG. 10, at a fixed offset value, a plurality of transducer measurements are taken at a first gain value and averaged, and a plurality of additional transducer measurements are taken at a second gain value and averaged. For each calibration axis, the fixed offset value, number of measurements to average, and the gain values may be configurable parameters that are stored in memory (e.g., memory 282, FIG. 2), in an embodiment. The fixed offset value and gain values may be stored as actual magnitudes, or they may be stored as an offset code (corresponding to a particular offset value) and gain codes (corresponding to particular gain values). When stored as gain codes, the gain codes may be considered to be "known gain codes," and the gain values associated with the known gain codes may be referred to below "known gain values," or as "C1" and "C2."

The calibration sub-process of FIG. 10 may begin, in block 1002, by determining the various parameters associated with the process. More particularly, in an embodiment, the microcontroller of the transducer-including device (e.g., microcontroller 280, FIG. 2) may retrieve the fixed offset value (or code), the number of measurements to average, and the two known gain values, C1 and C2, from memory (e.g., memory 282, FIG. 2). For example, the fixed offset value may be a value roughly or precisely in the center of the range of possible offset values, although the fixed offset value may correspond to a value that is not in the center of the range of offset values, as well. According to an embodiment, the number of measurements to average may be in a range of two measurements to about 10 measurements or more, depending upon the desired speed and accuracy of the calibration sub-process. Finally, one of the known gain values may have a value that is higher than a central gain value (i.e., a gain value in the center of the range of possible gain values), and the other known gain value may have a value that is lower than the central gain value. For example, the first known gain value may be about 75 percent of the maximum gain that may be applied, and the second known gain value may be about 25 percent of the maximum gain, although the first and second known gain values may be different, as well.

In block 1004, the device sets the gain of its amplifier (e.g., the amplifier in gain and filter circuitry 260, FIG. 2) to the first known gain value, C1, and takes a first plurality of transducer measurements (e.g., a number of measurements that is equal to the specified number of measurements to average). The device then calculates a first average of the measurements taken at the first gain value. In block 1006, the device then sets the gain to the second known gain value, C2, and takes a second plurality of transducer measurements (e.g., a number of measurements that is equal to the specified number of measurements to average). The device then calculates a second average of the measurements taken at the second gain value. In block 1008, the first and second averages are stored (e.g., in memory 282, FIG. 2) for later use (e.g., during execution of the sub-process of FIG. 11), and the method may end. As a result of performing the process of FIG. 10, two transducer measurement averages are stored in memory. The first measurement average corresponds to the first known gain value, C1, and a known gravitational force (e.g., +1 G or −1 G) associated with the current orientation of the device. The second measurement average corresponds to the second known gain value, C2, and the known gravitational force (e.g., +1 G or −1 G) associated with the current orientation of the device. The first and second measurement averages may be referred to below as "$M1_{C1}$" and "$M2_{C2}$," respectively.

Figure 11:
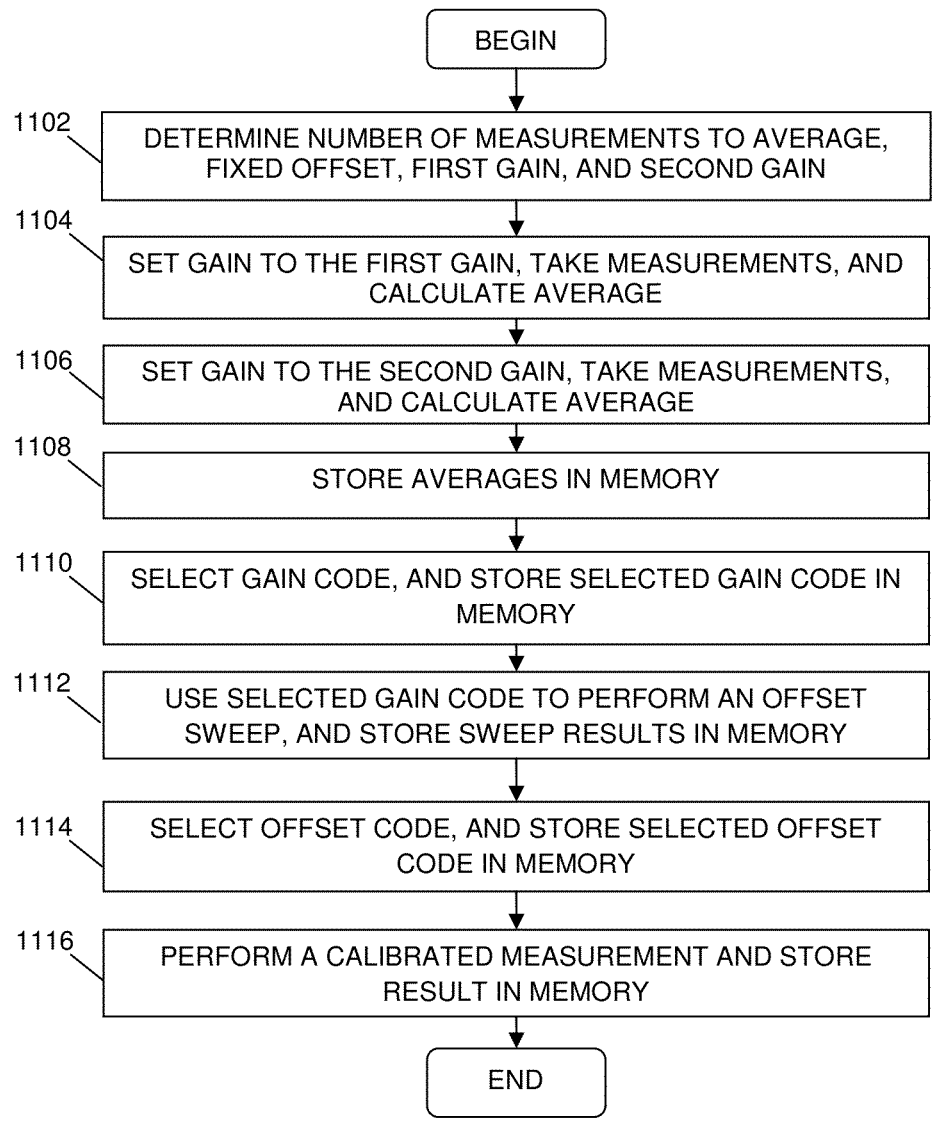
FIG. 11 is a flowchart of a calibration sub-process, in accordance with another example embodiment.

FIG. 11 is a flowchart of a calibration sub-process, in accordance with another example embodiment. As mentioned above, the calibration sub-process of FIG. 11 may be a complementary process to the calibration sub-process of FIG. 10 (i.e., the sub-process of FIG. 11 may use the results obtained from the sub-process of FIG. 10). According to an embodiment, the sub-process of FIG. 11 is performed after the device has been rotated approximately 180 degrees around an axis orthogonal to the calibration axis, with respect to the orientation in which the sub-process of FIG. 10 was performed. Accordingly, where the process of FIG. 10 was performed when a first known gravitational force (e.g., +1 G or −1 G) was being exerted along the calibration axis, the process of FIG. 11 is performed when a second known gravitational force of opposite sign (e.g., −1 G or +1 G) is being exerted along the calibration axis.

According to an embodiment, the first four blocks of FIG. 11 are substantially similar to the four blocks representing the sub-process of FIG. 10. More particularly, the calibration sub-process of FIG. 11 may begin, in block 1102, by determining the various parameters associated with the process (e.g., retrieving the fixed offset value (or code), the number of measurements to average, and the two known gain values, C1 and C2, from memory 282, FIG. 2). According to an embodiment, the fixed offset value, the number of measurements to average, and the first and second known gain values, C1 and C2, are equal to the values used in performing the sub-process of FIG. 10.

In block 1104, the device sets the gain of the amplifier (e.g., of gain and filter circuitry 260, FIG. 2) to the first known gain value, C1, and takes a third plurality of transducer measurements (e.g., at least a number of measurements that is equal to the specified number of measurements to average). The device then calculates a third average of the measurements taken at the first gain value. In block 1106, the device then sets the gain to the second known gain value, C2, and takes a fourth plurality of transducer measurements (e.g., at least a number of measurements that is equal to the specified number of measurements to average). The device then calculates a fourth average of the measurements taken at the second gain value. In block 1108, the third and fourth averages are stored (e.g., in memory 282, FIG. 2). As a result of performing blocks 1102 and 1104, two additional transducer measurement averages are stored in memory. The third measurement average corresponds to the first known gain value, C1, and a second known gravitational force (e.g., −1 G or +1 G) associated with the current orientation of the device. The fourth measurement average corresponds to the second known gain value, C2, and the second known gravitational force (e.g., −1 G or +1 G) associated with the current orientation of the device. The third and fourth measurement averages may be referred to below as "$M3_{C1}$" and "$M4_{C2}$," respectively. Having also calculated, in blocks 1004 and 1006, measurement averages ($M1_{C1}$ and $M2_{C2}$) for the first and second known gain values when the device was in an orientation associated with the first known gravitation force of opposite sign (e.g., +1 G or −1 G), the memory of the device now contains first, second, third, and fourth stored measurement averages representing measurements at two known gravitational forces (e.g., +1 G and −1 G), which were taken with two known gain values, C1 and C2.

For each calibration axis, the device specifications may stipulate a target sensitivity or target offset (e.g., defined in G/count or G/LSB) with an error window (e.g., 0.118 G/count+/−15 percent). The device specifications also may stipulate a digital code per G, with an error window (e.g., code 255 for 30 G, +/−3 G). The device specifications alternatively or additionally may specify other sensitivity or offset related parameters. According to an embodiment, using the measurement averages calculated in blocks 1004, 1104, 1006, and 1106, the device determines a gain value and/or an offset value that are likely to ensure that the device may substantially achieve the performance parameters stipulated in the device specifications. The device then selects a corresponding gain code and offset code, as described in more detail below.

In block 1110, a gain value is determined based on the stored first, second, third, and fourth averages, and a gain code corresponding to the determined gain value is selected and stored (e.g., in memory 282, FIG. 2). Any of several algorithms may be used to determine the gain value and corresponding gain code using the previously-acquired measurements (e.g., $M1_{C1}$, $M2_{C2}$, $M3_{C1}$, and $M4_{C2}$ determined in blocks 1004, 1006, 1104, 1106). For example, and not by way of limitation, an embodiment of a gain value determination algorithm may include:

determining a first offset value, S1, using the average measurements taken when the gain of the amplifier was set to the first gain value (corresponding to a first known gain code, C1) in the first and second positions (e.g., $M1_{C1}$ and $M3_{C1}$ determined in blocks 1004 and 1104). For example, the first offset value may be determined using Equation 1, below:

$$S1 = (M1_{C1} - M3_{C1})/2G \quad \text{(Equ. 1)}$$

determining a second offset value, S2, using the average measurements taken when the gain of the amplifier was set to the second gain value (corresponding to the second known gain code, C2) in the first and second positions (e.g., the average measurements determined in blocks 1006 and 1106). For example, the second offset value may be determined using Equation 2, below:

$$S2 = (M2_{C2} - M4_{C2})/2G \quad \text{(Equ. 2)}$$

performing an interpolation process to determine an offset value for each of the other valid gain codes. For example, using the two calculated offset values, S1 and S2, associated with the two known gain codes, C1 and C2, two linear equations (in the form y=mx+b) may be formulated as:

$$S1 = mC1 + b \quad \text{(Equ. 3)}$$

$$S2 = mC2 + b, \quad \text{(Equ. 4)}$$

and the values for m and b may be determined from the equations. Once m and b are determined, the process may include sweeping the gain values for all remaining valid gain codes (e.g., in the stored gain code table), and solving for offset for each gain value. During this process, a relational table may be populated and stored (e.g., in memory 282, FIG. 2), where each index corresponds to a gain value associated with a gain code (x), and each result corresponds to an offset value (y).

The example equations provided above assume that +1 G and −1 G are used as set points for the trim. In other words, each of the transducer measurements used in the equations was taken when the corresponding calibration axis was aligned with the gravitational force vector (e.g., when the device is in one of the orientations shown in FIG. 13). In other embodiments, transducer measurements may be taken when the calibration axis or axes are not aligned with the gravitational force vector (e.g., when the device is in one of the orientations shown in FIG. 14). In such embodiments, the example equations provided above may be modified to account for the vector mathematics that may be employed to calculate the offset and gain values. Such embodiments are intended to fall within the scope of the inventive subject matter.

According to an embodiment, a gain code is selected based on the target offset stipulated in the specification. For example, using the relational table created during the above process, the selected gain code may be the gain code that is associated with an offset value that is closest to the specified target offset value. The selected gain code (or the gain value associated with that gain code) is then stored (e.g., in memory 282, FIG. 2) for the transducer associated with the calibration axis.

In block 1112, the device's amplifier is set to the gain value associated with the selected gain code, and a plurality of additional transducer measurements are taken at a plurality of offset values. For example, the device first may be configured to apply the gain value associated with the selected gain code. Thereafter, the device may perform multiple measurement iterations, where a different offset is applied during each iteration. The applied offsets may be selected sequentially from an offset code table stored in the device (e.g., such as the offset code table shown in Table 2, above), where each offset has a corresponding offset code. In other words, with the amplifier configured to apply a gain value corresponding to the selected gain code, transducer measurements are obtained during a sweep of offset values stored in the offset code table. According to an embodiment, the transducer measurements obtained during the offset sweep are stored (e.g., in memory 282, FIG. 2).

In block 1114, an offset code is selected based on the transducer measurements stored during the offset sweep. More specifically, the selected offset code may be the offset code that is associated with an offset value (determined in block 1112) that is closest to the specified target offset value. The selected offset code is then stored (e.g., in memory 282, FIG. 2) for the transducer associated with the calibration axis. In an alternate embodiment, the offset value corresponding to the selected offset code may be stored for the transducer, rather than storing the selected offset code.

In block 1116, a calibrated measurement may then be performed with the device configured to apply the gain value associated with the selected gain code and to apply the offset value associated with the selected offset code. The results of the calibrated measurement process may then be stored (e.g., in memory 282, FIG. 2), and the method may end.

The calibration sub-processes of FIGS. 10 and 11 may be modified in various ways. For example, although the sub-processes includes taking measurements at two gain values, other sub-processes may include taking measurements at only one gain value or at more than two gain values. In addition, although the measurements are averaged in the above-described embodiment, other mathematical formulas could be applied to the measurements in other embodiments. In addition, various other mathematical formulas could be used to select gain values and offset values.

Figure 12:
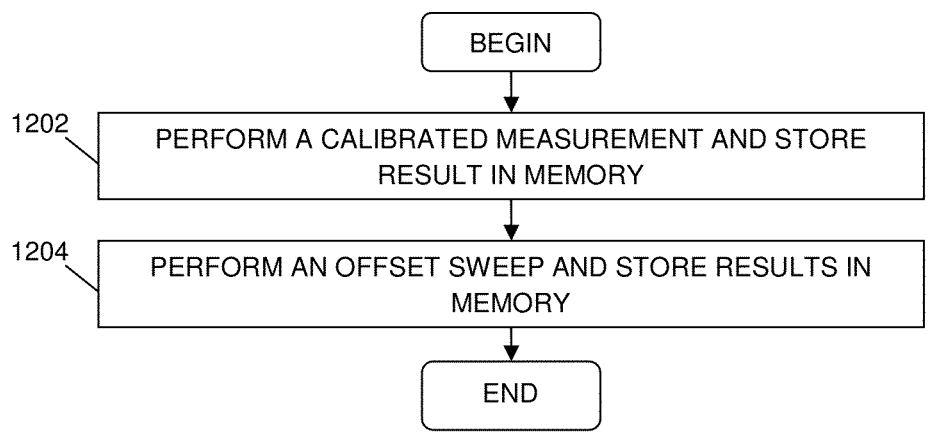
FIG. 12 is a flowchart of a calibration sub-process, in accordance with yet another example embodiment.

FIG. 12 is a flowchart of a calibration sub-process, in accordance with yet another example embodiment. The calibration sub-process of FIG. 12 may be used simply to collect measurement data that may later be retrieved and evaluated for various purposes (e.g., for validating the calibration process). The method may begin, in block 1202, when a calibrated measurement is be performed with the device configured to apply the gain value associated with the selected gain code and to apply the offset value associated with the selected offset code. The results of the calibrated measurement process may then be stored (e.g., in memory 282, FIG. 2).

In block 1204, an offset sweep may then be performed with the gain set to the gain value corresponding to the selected gain code. The measurement results obtained from the offset sweep may then be stored (e.g., in memory 282, FIG. 2), and the method may end.

Although FIGS. 8-12 illustrate particular sequences of steps associated with calibration processes, it should be understood that the sequences may be modified while achieving substantially the same results or similar results. For example, rather than waiting to calculate calibration coefficients associated with all transducers until the device has been transferred through an entire sequence of orientations and all transducer data has been collected, calibration coefficients for a particular transducer may be calculated as soon as sufficient transducer data for the transducer has been collected. In addition, although various commands and indications are discussed in conjunction with the embodiments illustrated in FIGS. 8-12, the commands and indications may be different from those discussed above. For example, the various signals and indications discussed above could be provided in different formats, using different contacts or "pins," and so on. In addition, in some cases, it may be desirable to have the devices execute multiple calibration sub-processes while in a particular orientation (e.g., the devices may be sent multiple calibration commands while in a particular orientation, and the devices accordingly execute multiple calibration sub-processes in the orientation). Various other modifications to the embodiments of the calibration methods discussed in conjunction with FIGS. 8-12 may be made without departing from the scope of the inventive subject matter.

Figure 13:
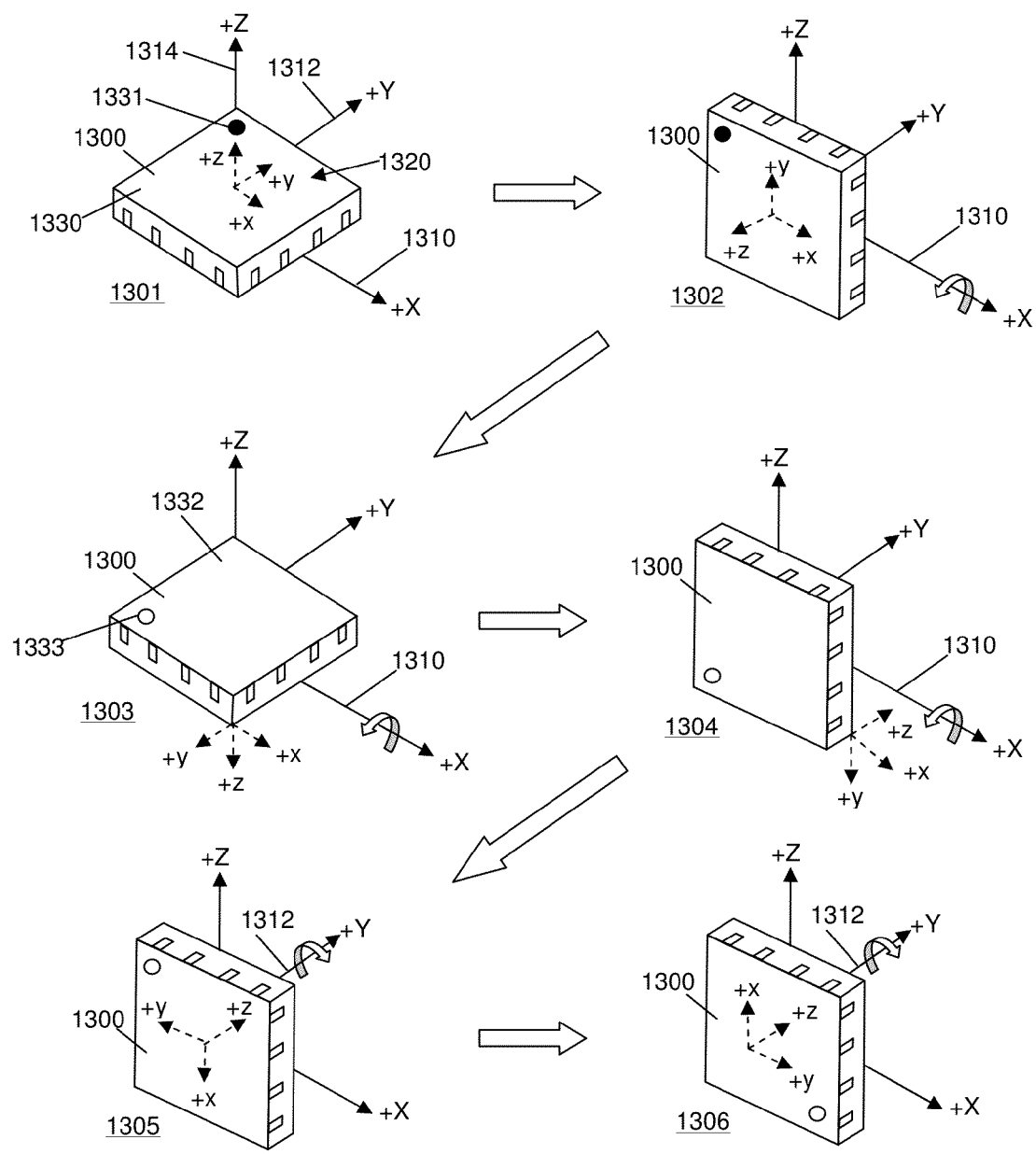
FIG. 13 illustrates an example of a pre-determined sequence of orientations through with a system may put a transducer-including device with respect to a fixed coordinate system, in accordance with an example embodiment.

Referring now to FIG. 13, an example is shown of a pre-determined sequence of orientations 1301-1306 through with a system (e.g., system 300, FIG. 3) may put a transducer-including device 1300 with respect to a fixed coordinate system (represented by axes 1310, 1312, 1314), in accordance with an example embodiment. More specifically, FIG. 13 is intended to show a sequence of orientations that a device handling system (e.g., device handling system 350, FIG. 3) may put a plurality of transducer-including devices through under the control of a calibration controller (e.g., calibration controller 310, FIG. 3). To avoid cluttering FIG. 13, the calibration board and board support structure that would make movement of the device 1300 and other devices possible is not illustrated. In addition, in FIG. 13, a "pin 1" top surface indicator 1331 is illustrated as a solid black circle on the top surface 1330 of device 1300. To indicate a corresponding corner of device 1300 in orientations in which only the bottom surface 1332 of device 1300 is shown (i.e., orientations 1303-1306), a "pin 1" bottom surface indicator 1333 is illustrated as a white-filled circle on the bottom surface 1332 of device 1300.

Transducer data from accelerometers and magnetometers within device 1300 (e.g., accelerometers 212-214 and magnetometers 232-234, FIG. 2) may be collected when device 1300 is in each of the orientations 1301-1306, in an embodiment. Conversely, transducer data from gyroscopes (e.g., gyroscopes 222-224, FIG. 2) may be collected while device 1300 is being moved from one orientation to another at a pre-defined rate of rotation. In the example sequence of FIG. 13, device 1300 is transitioned to a plurality of orientations 1301-1306 in which orthogonal device-fixed axes 1320 align with orthogonal fixed axes 1310, 1312, 1314. In an embodiment, device 1300 is transitioned from one orientation by rotating device 1300 around one of the fixed axes 1310, 1312, 1314. According to an embodiment, a calibration system capable of achieving the orientations 1301-1306 shown in FIG. 13 would be capable of, at least, rotating device 1300 around two fixed, orthogonal axes (e.g., X-axis 1310 and Z-axis 1314). In other embodiments, a calibration system may be capable of rotating devices around a single axis (e.g., as in the embodiment illustrated in FIGS. 6 and 7), or a calibration system may be capable of rotating devices around all three orthogonal axes.

In the example of FIG. 13, for the purpose of further explanation, one may assume that a primary acceleration, force or field being sensed is strongest along the Z-axis 1314 of the fixed coordinate system. For example, a gravitational force vector may extend in the −Z direction along Z-axis 1314. Accordingly, in the first orientation 1301, device 1300 would experience a +1 G acceleration due to gravity along the device-fixed z-axis, and 0 G acceleration due to gravity along the device-fixed x-axis and y-axis. If device 1300 is rotated (e.g., by device handling system 350, FIG. 3) by 90 degrees around the fixed X-axis 1310 to second orientation 1302, device 1300 would experience a +1 G acceleration due to gravity along the device-fixed y-axis, and 0 G acceleration due to gravity along the device-fixed x-axis and z-axis. If device 1300 is thereafter rotated by 90 degrees around the fixed X-axis 1310 to third orientation 1303, device 1300 would experience a −1 G acceleration due to gravity along the device-fixed z-axis, and 0 G acceleration due to gravity along the device-fixed x-axis and y-axis. If device 1300 is thereafter rotated by 90 degrees around the fixed X-axis 1310 to fourth orientation 1304, device 1300 would experience a −1 G acceleration due to gravity along the device-fixed y-axis, and 0 G acceleration due to gravity along the device-fixed x-axis and z-axis. If device 1300 is thereafter rotated by 90 degrees around the fixed Y-axis 1312 to fifth orientation 1305, device 1300 would experience a −1 G acceleration due to gravity along the device-fixed x-axis, and 0 G acceleration due to gravity along the device-fixed y-axis and z-axis. Finally, if device 1300 is thereafter rotated by 180 degrees around the fixed Y-axis 1312 to sixth orientation 1306, device 1300 would experience a +1 G acceleration due to gravity along the device-fixed x-axis, and 0 G acceleration due to gravity along the device-fixed y-axis and z-axis.

In an example embodiment, device 1300 may include a three-axis accelerometer (e.g., device 1300 includes x-axis accelerometer 212, y-axis accelerometer 213, and z-axis accelerometer 214, FIG. 2) and each accelerometer is associated with a corresponding device-fixed axis 1320. An embodiment of a calibration controller may send calibration commands to device 1300 when device 1300 is in each of orientations 1301-1306, where each calibration command would indicate which accelerometer outputs should be collected while in the given orientation 1301-1306. More specifically, in the example, each calibration command would indicate that samples should be collected from the accelerometer corresponding to the device-fixed axis 1320 currently aligned with the fixed Z-axis 1314. In addition, the calibration command may indicate the direction of alignment (e.g., in the positive or negative direction). In other words, each calibration command may indicate the orientation 1301-1306 in which the device 1300 has been placed. After collecting accelerometer data for a given device-fixed axis, a microcontroller of the device 1300 (e.g., microcontroller 280, FIG. 2) may calculate calibration coefficients for the accelerometer associated with that axis, and store the calibration coefficients in memory (e.g., memory 282, FIG. 2), in an embodiment.

In another example embodiment, device 1300 may include a three-axis magnetometer (e.g., device 1300 includes x-axis magnetometer 232, y-axis magnetometer 233, and z-axis magnetometer 234, FIG. 2), and one may assume for example that a primary magnetic field being sensed is strongest along the Z-axis 1314 of the fixed coordinate system. Each magnetometer may be associated with a corresponding device-fixed axis 1320. An embodiment of a calibration controller may send calibration commands to device 1300 when device 1300 is in each of orientations 1301-1306, where each calibration command would indicate which magnetometer outputs should be collected while in the given orientation 1301-1306. More specifically, in the example, each calibration command would indicate that samples should be collected from the magnetometer corresponding to the device-fixed axis 1320 currently aligned with the fixed Z-axis 1314. In addition, the calibration command may indicate the direction of alignment (e.g., in the positive or negative direction). After collecting magnetometer data for a given device-fixed axis, a microcontroller of the device 1300 (e.g., microcontroller 280, FIG. 2) may calculate calibration coefficients for the magnetometer associated with that axis, and store the calibration coefficients in memory (e.g., memory 282, FIG. 2), in an embodiment.

In yet another example embodiment, device 1300 may include a three-axis gyroscope (e.g., device 1300 includes x-axis gyroscope 222, y-axis gyroscope 223, and z-axis gyroscope 224, FIG. 2), and each gyroscope may be associated with a corresponding device-fixed axis 1320. An embodiment of a calibration controller may send calibration commands to device 1300 while device 1300 is rotating between orientations 1301-1306, and each calibration command would indicate which gyroscope outputs should be collected while being rotated between orientations 1301-1306. More specifically, in the example, each calibration command would indicate that samples should be collected from the gyroscope corresponding to the device-fixed axis 1320 around which the device 1300 is being rotated. In addition, the calibration command may indicate the direction of rotation (e.g., in the positive or negative direction) and/or the rate of rotation. After collecting gyroscope data for a given device-fixed axis, a microcontroller of the device 1300 (e.g., microcontroller 280, FIG. 2) may calculate calibration coefficients for the gyroscope associated with that axis, and store the calibration coefficients in memory (e.g., memory 282, FIG. 2), in an embodiment.

It is to be understood that FIG. 13 is intended to show an example of a pre-determined sequence of orientations 1301-1306, and the example shown should not be construed as limiting. Other pre-determined sequences may include transitioning a device through orientations 1301-1306 in a different order, transitioning a device through a subset of orientations 1301-1306, and/or transitioning a device through additional and/or different orientations than those shown in FIG. 13. In addition, in each of the orientations 1301-1306, one of the device-fixed axes 1320 is aligned with a gravitational force or the primary orientation of a magnetic field (e.g., aligned with the Z-axis 1314 of the fixed coordinate system), and the other device-fixed axes 1320 are in a plane orthogonal to the Z-axis. Accordingly, maximum sensor output values would be expected for the sensors associated with the device-fixed axis aligned with the Z-axis 1314, and negligible sensor output values would be expected for the sensors associated with the device-fixed axes that are not aligned with the Z-axis 1314. In other embodiments, a device may be transitioned through a sequence of orientations in which none of the device-fixed axes are aligned with a gravitational force or the primary orientation of a magnetic field. In such embodiments, components of the gravitational force or magnetic field strength may be experienced along multiple ones of the device-fixed axes, and calibration coefficients may be calculated accordingly.

Figure 14:
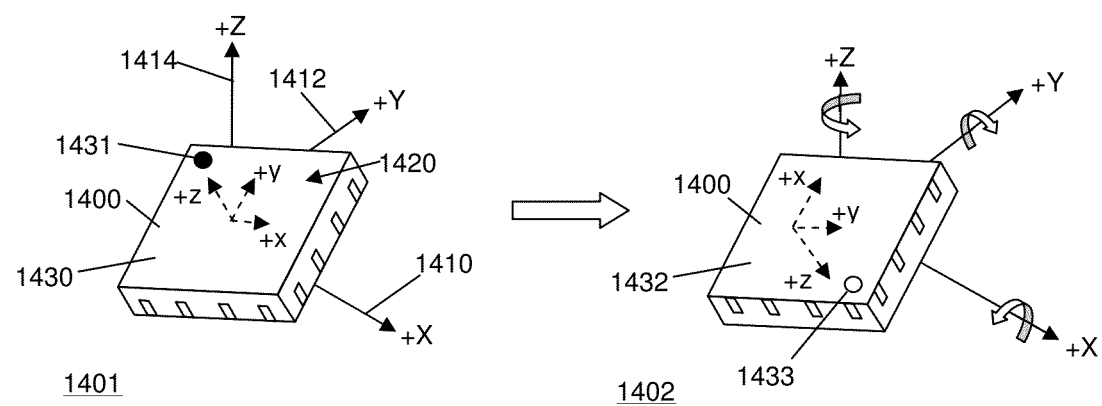
FIG. 14 illustrates an example of a pre-determined sequence of orientations through with a system may put a transducer-including device with respect to a fixed coordinate system, in accordance with another example embodiment.

For example, FIG. 14 illustrates an example of a pre-determined sequence of orientations 1401, 1402 through with a system (e.g., system 300, FIG. 3) may put a transducer-including device 1400 with respect to a fixed coordinate system (represented by axes 1410, 1412, 1414), in accordance with another example embodiment. In FIG. 14, a "pin 1" top surface indicator 1431 is shown on the top surface 1430 of device 1400 in orientation 1401, and a "pin 1" bottom surface indicator 1433 is shown on the bottom surface 1432 of device 1400 in orientation 1402.

Again, transducer data from accelerometers and magnetometers within device 1400 (e.g., accelerometers 212-214 and magnetometers 232-234, FIG. 2) may be collected when device 1400 is in each of the orientations 1401, 1402, in an embodiment. Conversely, transducer data from gyroscopes (e.g., gyroscopes 222-224, FIG. 2) may be collected while device 1400 is being moved from one orientation to another at pre-defined rates of rotation around the fixed axes 1410, 1412, 1414. In the example sequence of FIG. 14, device 1400 is transitioned from a first orientation 1401 in which each of orthogonal device-fixed axes 1420 are angularly offset from corresponding orthogonal fixed axes 1410, 1412, 1414 by approximately 45 degrees, to a second orientation 1402 in which each of device-fixed axes 1420 are angularly offset from corresponding fixed axes 1410, 1412, 1414 by approximately 225 degrees. In an embodiment, device 1400 is transitioned from one orientation to another by rotating device 1300 around one of the fixed axes 1410, 1412, 1414. The angular offsets between the device fixed axes 1420 and the corresponding fixed axes 1410, 1412, 1414 may be achieved, in an embodiment by using a board support structure (e.g., board support structure 354, FIG. 3) that is configured to support a calibration board (e.g., calibration board 370, FIG. 3) at 45 degree angles with respect to the axes of rotation of the motor(s) (e.g., motor(s) 356, FIG. 3).

In the example of FIG. 14, when a primary force being sensed is strongest along the Z-axis 1414 of the fixed coordinate system, approximately equal rates of acceleration (e.g., about +/−0.33 G) should be sensed by each accelerometer of a three-axis accelerometer of the device 1400. According to an embodiment, a calibration controller sends a command to device 1400 in each orientation 1401, 1402, and after collecting accelerometer data for each of the device-fixed axes, a microcontroller of the device 1400 (e.g., microcontroller 280, FIG. 2) may calculate calibration coefficients for each of the accelerometers using appropriate vector mathematics. Device 1400 may thereafter store the calibration coefficients in memory (e.g., memory 282, FIG. 2), in an embodiment.

Similarly, when a primary magnetic field being sensed is strongest along the Z-axis 1414 of the fixed coordinate system, approximately equal magnetic field strength magnitudes should be sensed by each magnetometer of a three-axis magnetometer of the device 1400. According to an embodiment, a calibration controller sends a command to device 1400 in each orientation 1401, 1402, and after collecting magnetometer data for each of the device-fixed axes, a microcontroller of the device 1400 (e.g., microcontroller 280, FIG. 2) may calculate calibration coefficients for each of the magnetometers using appropriate vector mathematics. Device 1400 may thereafter store the calibration coefficients in memory (e.g., memory 282, FIG. 2), in an embodiment.

An embodiment of a method for calibrating a packaged device that includes one or more transducers includes steps performed by the packaged device. The steps of the method performed by the packaged device include receiving a first calibration command from an external calibration controller through an interface, and executing first code in response to receiving the first calibration command. Executing the first code includes generating first transducer data from a transducer of the one or more transducers, calculating calibration coefficients using the first transducer data, and storing the calibration coefficients within a memory of the device.

An embodiment of a method for calibrating a plurality of packaged, transducer-including devices includes sending, through a communication structure, calibration commands to the plurality of transducer-including devices. The calibration commands cause each of the transducer-including devices to execute code stored in memories of the transducer-including devices. Execution of the code causes the transducer-including devices to generate transducer data, calculate calibration coefficients using the transducer data, and store the calibration coefficients within the memories of the transducer-including devices.

An embodiment of a packaged transducer-including device includes one or more transducers, an interface configured to facilitate communications with an external calibration controller, a memory, and a processing component. The processing component is configured to receive calibration commands from the external controller through the interface, and to execute code in response to receiving the calibration commands. Execution of the code includes generating transducer data from the one or more transducers, calculating calibration coefficients using the transducer data, and storing the calibration coefficients within the memory.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for calibrating a packaged device that includes one or more transducers, the method performed by the packaged device and comprising the steps of:

receiving a first calibration command from an external calibration controller through an interface;

executing first code in response to receiving the first calibration command, wherein executing the first code includes generating first transducer data from the one or more transducers;

receiving a second calibration command from the external calibration controller through the interface; and executing second code in response to receiving the second calibration command, wherein executing the second code includes generating second transducer data from a transducer of the one or more transducers, calculating calibration coefficients using the first transducer data and the second transducer data, and storing the calibration coefficients within a memory of the device.

2. The method of claim 1, wherein the calibration coefficients are selected from a gain value, a gain code, an offset value, and an offset code.

3. The method of claim 1, further comprising:
prior to receiving the first calibration command, producing a ready indicator for the calibration controller.

4. The method of claim 3, wherein producing the ready indicator comprises:
producing a voltage at a contact of the packaged device, wherein the voltage has a voltage level that corresponds to the ready indicator.

5. The method of claim 1, wherein the calibration coefficients specify a selected gain value and a selected offset value, and the method further comprises:
after executing the second code, configuring the device to apply the selected gain value and the selected offset value to an output signal of the transducer; and
generating and storing calibrated transducer data.

6. The method of claim 1, further comprising:
receiving a final command from the calibration controller;
executing third code in response to receiving the final command, wherein executing the third code includes verifying validity of calibration results; and
after executing the third code, producing a calibration complete indicator for the calibration controller.

7. The method of claim 6, wherein producing the calibration complete indicator comprises toggling a voltage at a contact of the packaged device.

8. A method for calibrating a plurality of packaged, transducer-including devices, the method comprising the steps of:
sending, through a communication structure, a first calibration command to a plurality of transducer-including devices when the plurality of transducer-including devices is in a first orientation, wherein the first calibration command causes each of the transducer-including devices to execute first code stored in memories of the transducer-including devices, and wherein execution of the first code causes the transducer-including devices to generate first transducer data;
causing a motor control module to rotate the plurality of transducer-including devices from the first orientation to a second orientation in a series of orientations; and
sending a second calibration command to the plurality of transducer-including devices when the plurality of transducer-including devices is in the second orientation, wherein the second calibration command causes each of the transducer-including devices to execute second code that causes the transducer-including devices to generate second transducer data, to calculate calibration coefficients using the first transducer data and the second transducer data, and to store the calibration coefficients within the memories of the transducer-including devices.

9. The method of claim 8, wherein the calibration coefficients are selected from a gain value, a gain code, an offset value, and an offset code.

10. A method for calibrating a plurality of packaged, transducer-including devices, the method comprising the steps of:
waiting for ready indicators from the plurality of transducer-including devices; and
after receiving the ready indicators, sending, through a communication structure, calibration commands to the plurality of transducer-including devices, wherein the calibration commands cause each of the transducer-including devices to execute code stored in memories of the transducer-including devices, and wherein execution of the code causes the transducer-including devices to generate transducer data, to calculate calibration coefficients using the transducer data, and to store the calibration coefficients within the memories of the transducer-including devices.

11. The method of claim 10, wherein waiting for the ready indicators comprises:
determining if a voltage at a contact of each of the plurality of transducer-including devices has a voltage level that corresponds to the ready indicator.

12. The method of claim 11, further comprising:
indicating an error for each of the transducer-including devices from which the ready indicator is not received before expiration of a timeout period.

13. A method for calibrating a plurality of packaged, transducer-including devices, the method comprising the steps of:
sending, through a communication structure, calibration commands to a plurality of transducer-including devices, wherein the calibration commands cause each of the transducer-including devices to execute code stored in memories of the transducer-including devices, and wherein execution of the code causes the transducer-including devices to generate transducer data, to calculate calibration coefficients using the transducer data, and to store the calibration coefficients within the memories of the transducer-including devices;
determining whether the plurality of transducer-including devices have been positioned in all orientations in a series of orientations;
when the plurality of transducer-including devices have been positioned in all orientations, sending a final command to the plurality of transducer-including devices, which causes the transducer-including devices to perform a validity verification process in which the transducer-including devices verify validity of calibration results; and
waiting for calibration complete indicators from the plurality of transducer-including devices, indicating that the plurality of transducer-including devices have completed the validity verification process.

14. The method of claim 13, further comprising:
indicating an error for each of the transducer-including devices from which the calibration complete indicator is not received before expiration of a timeout period.

15. A packaged transducer-including device comprising:
one or more transducers;
an interface configured to facilitate communications with an external calibration controller;
a memory; and a processing component configured
- to receive a first calibration command from the external controller through the interface,
- to execute first code in response to receiving the first calibration command, wherein execution of the first code includes generating first transducer data from the one or more transducers,
- to receive a second calibration command from the external calibration controller through the interface, and
- to execute second code in response to receiving the second calibration command, wherein executing the second code includes generating second transducer data from a transducer of the one or more transducers, calculating calibration coefficients using the first transducer data and the second transducer data, and storing the calibration coefficients within the memory.

16. The transducer-including device of claim 15, wherein the calibration coefficients are selected from a gain value, a gain code, an offset value, and an offset code.

17. The transducer-including device of claim 15, wherein the one or more transducers are selected from one or more accelerometers, one or more gyroscopes, and one or more magnetic sensors.

18. A system for calibrating a plurality of packaged, transducer-including devices, the system comprising:
a calibration control module configured
- to send, through a communication structure, a first calibration command to the plurality of transducer-including devices while the plurality of transducer-including devices are loaded in sockets of a calibration board that is in a first orientation of a series of orientations, wherein the first calibration command causes each of the transducer-including devices to execute first code stored in memories of the transducer-including devices, and wherein execution of the first code causes the transducer-including devices to generate first transducer data,
- to cause a motor control module to rotate the calibration board to a second orientation in the series of orientations, and
- to send a second calibration command to the plurality of transducer-including devices while the calibration board is in the second orientation, which causes the plurality of transducer-including devices to execute second code that causes the transducer-including devices to generate second transducer data, to calculate calibration coefficients using the first transducer data and the second transducer data, and to store the calibration coefficients within the memories of the transducer-including devices.

19. The system of claim 18, wherein the calibration coefficients are selected from a gain value, a gain code, an offset value, and an offset code.

20. A system for calibrating a plurality of packaged, transducer-including devices, the system comprising:
a calibration control module configured to send, through a communication structure, calibration commands to the plurality of transducer-including devices, wherein the calibration commands cause each of the transducer-including devices to execute code stored in memories of the transducer-including devices, and wherein execution of the code causes the transducer-including devices to generate transducer data, to calculate calibration coefficients using the transducer data, and to store the calibration coefficients within the memories of the transducer-including devices;
a board support structure configured to hold a calibration board in a fixed position with respect to the board support structure;
one or more motors configured to rotate the board support structure around one or more axes of a fixed coordinate system;
a motor control module configured to send motor control signals to the one or more motors to cause the one or more motors to move the board support structure through a series of orientations with respect to the fixed coordinate system; and
the calibration board, wherein the calibration board includes a substrate, a plurality of sockets, a first connector, and a plurality of conductors, wherein each socket of the plurality of sockets includes a plurality of socket contacts configured to connect with a corresponding plurality of contacts of a transducer-including device, the plurality of conductors is configured to convey signals between the first connector and the plurality of socket contacts, and the first connector is configured to couple with the communication structure.

21. The system of claim 20, wherein the calibration control module is configured to:
- send a first calibration command to the plurality of transducer-including devices when the plurality of transducer-including devices is in a first orientation of the series of orientations, wherein the first calibration command causes each of the transducer-including devices to execute first code that causes the transducer-including devices to generate first transducer data;
- cause the motor control module to rotate the board support structure to a second orientation in the series of orientations; and
- send a second calibration command to the plurality of transducer-including devices, which causes the plurality of transducer-including devices to execute second code that causes the transducer-including devices to generate second transducer data, to calculate the calibration coefficients using the first transducer data and the second transducer data, and to store the calibration coefficients within the memories of the transducer-including devices.

* * * * *